United States Patent [19]
Ichikawa et al.

[11] Patent Number: 5,416,331
[45] Date of Patent: May 16, 1995

[54] SURFACE ATOM FABRICATION METHOD AND APPARATUS

[75] Inventors: Masakazu Ichikawa; Shigeyuki Hosoki; Fumihiko Uchida; Shigeo Kato; Yoshihisa Fujisaki; Sumiko Fujisaki; Atsushi Kikugawa, all of Tokyo; Ryo Imura, Tokorozawa; Hajime Aoi, Tokyo; Kiyokazu Nakagawa, Sayama; Eiichi Murakami, Tokyo, all of Japan

[73] Assignee: Hitachi, Ltd., Tokyo, Japan

[21] Appl. No.: 934,672
[22] PCT Filed: Jan. 10, 1992
[86] PCT No.: PCT/JP92/00015
§ 371 Date: Sep. 11, 1992
§ 102(e) Date: Sep. 11, 1992
[87] PCT Pub. No.: WO92/12528
PCT Pub. Date: Jul. 23, 1992

[30] Foreign Application Priority Data

| Jan. 11, 1991 | [JP] | Japan | 3-1912 |
| Jan. 11, 1991 | [JP] | Japan | 3-1913 |
| Jan. 11, 1991 | [JP] | Japan | 3-1914 |
| Jan. 11, 1991 | [JP] | Japan | 3-1915 |
| Jan. 11, 1991 | [JP] | Japan | 3-1916 |
| Jan. 11, 1991 | [JP] | Japan | 3-1917 |

[51] Int. Cl.[6] .................................. H01J 37/30
[52] U.S. Cl. .................. 250/492.2; 250/306; 250/307
[58] Field of Search .............. 250/306, 307, 423 F, 250/492.2, 398

[56] References Cited

U.S. PATENT DOCUMENTS

| 4,343,993 | 8/1982 | Binnig et al. | |
| 4,539,089 | 9/1985 | Binnig et al. | 204/192 R |
| 4,785,189 | 11/1988 | Wells | 250/492.2 |
| 4,896,044 | 1/1990 | Li et al. | 250/492.3 |
| 5,015,323 | 5/1991 | Gallagher | 250/492.3 |
| 5,043,578 | 8/1991 | Guethner et al. | 250/492.2 |
| 5,047,649 | 9/1991 | Hodgson | 250/492.2 |
| 5,126,574 | 6/1992 | Gallagher | 250/492.2 |
| 5,138,174 | 8/1992 | Tang | 250/492.2 |
| 5,144,581 | 9/1992 | Toda et al. | 250/306 |
| 5,216,254 | 6/1993 | Ohta et al. | 250/492.2 |

FOREIGN PATENT DOCUMENTS

376045 7/1990 European Pat. Off. .

OTHER PUBLICATIONS

Nature, vol. 344, Apr. 5, 1990, pp. 524–526.
Applied Physics Letters, vol. 55, No. 13, 1989, pp. 1312–1314.
(List continued on next page.)

*Primary Examiner*—Bruce C. Anderson
*Attorney, Agent, or Firm*—Fay, Sharpe, Beall, Fagan, Minnich & McKee

[57] ABSTRACT

A fine-fabrication method of solid surfaces relates to a new surface fabrication method allows a solid-device surface to be fabricated at an atomic scale so as to produce an ultra-fine device or a device for recording information at an ultra-high density. A probe is installed with a tip thereof facing to the surface of a specimen to undergo fabrication. A voltage for forming an electric field is applied between the probe and the specimen. The electric field is large enough to field-evaporate atoms constituting the specimen or the probe; the electric field field-evaporates atoms constituting the specimen, removing them from the surface of the specimen; and as another alternative, the electric field field-evaporates atoms constituting the probe, depositing them on the surface of the specimen. Further, in another surface atom fabrication method, while the surface of a specimen is observed at an atomic scale using a surface observation technique by means of a scanning tunnelling microscope, a pulsative voltage large enough for the field evaporation of atoms described above is applied between the probe and the specimen at any arbitrary desired positions on the surface of the specimen; and the pulsative voltage field-evaporates and, hence, eliminates atoms one by one from the surface of the specimen.

36 Claims, 22 Drawing Sheets

OTHER PUBLICATIONS

IBM Technical Disclosure Bulletin, "Method of Producing Fine Lines Using A Scanning Tunneling Microscope", vol. 32, No. 6B, Nov. 1989, pp. 140–141.
IBM Technical Disclosure Bulletin, "Direct Pattern Writing by Local heating in a Scanning Tunneling Micrscope", vol. 29, No. 6, Nov 1986, pp. 2680–2681.
Patent Abstracts of Japan, Abstract of JP-A-1312753, vol. 14, No. 116, Mar. 1990.
Patent Abstracts of Japan, Abstract of JP-A-2295050, vol. 15, No. 74, Feb. 1991.

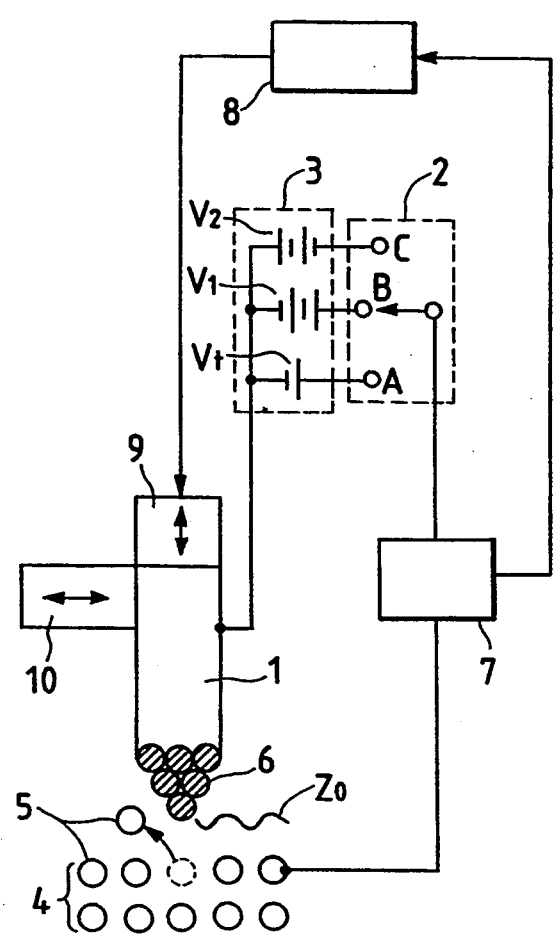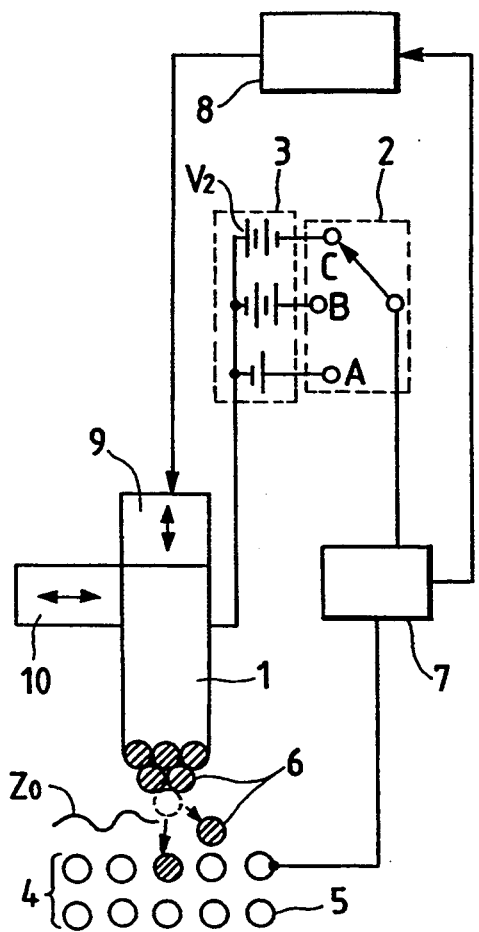

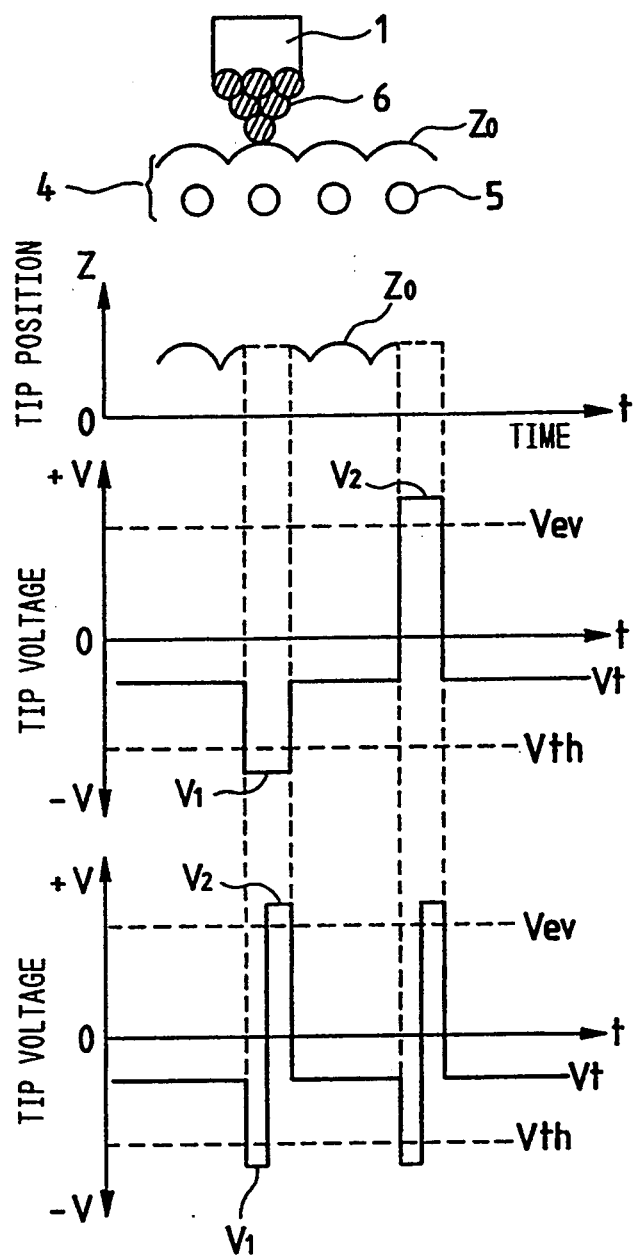

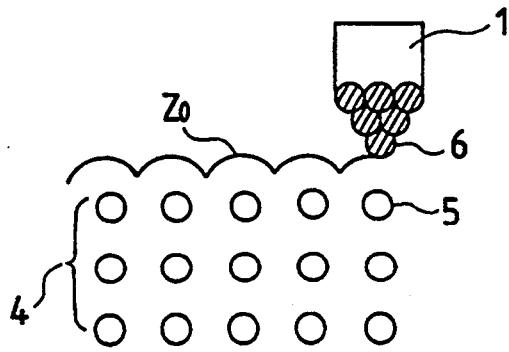
FIG. 4(a₁)
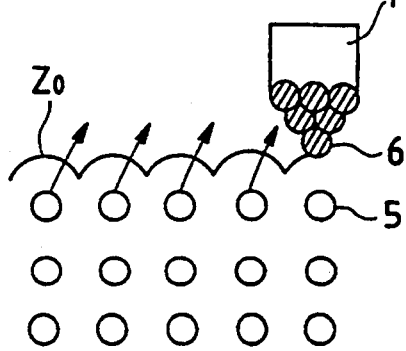
FIG. 4(b₁)
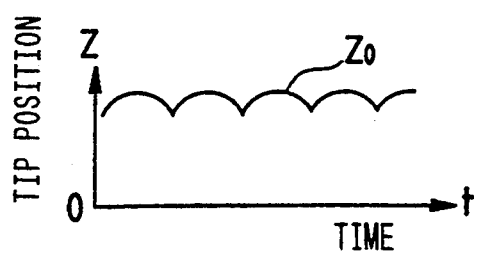
FIG. 4(a₂)
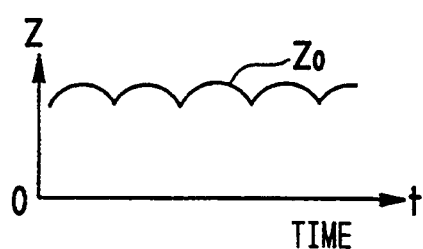
FIG. 4(b₂)
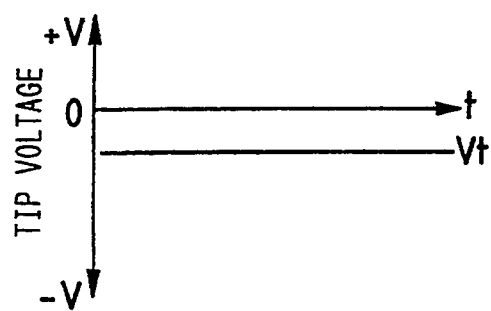
FIG. 4(a₃)
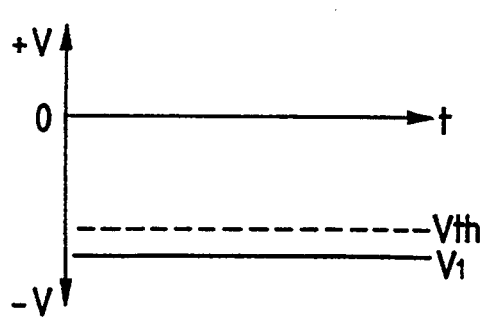
FIG. 4(b₃)

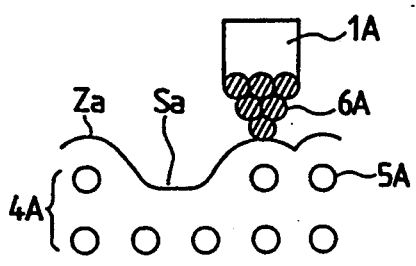
FIG. 7(a₁)
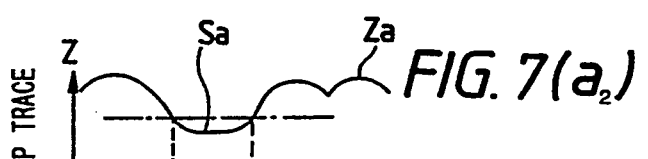
FIG. 7(a₂)
FIG. 7(a₃)
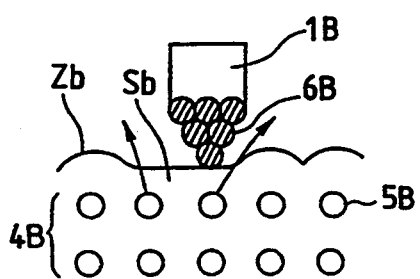
FIG. 7(b₁)
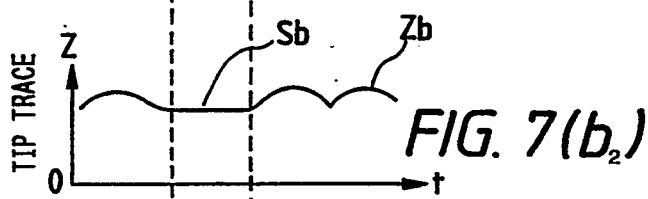
FIG. 7(b₂)
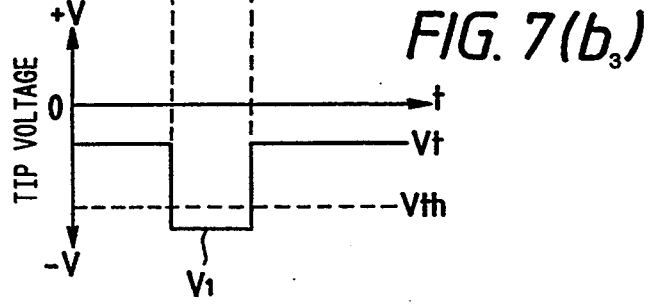
FIG. 7(b₃)

FIG. 8(a)
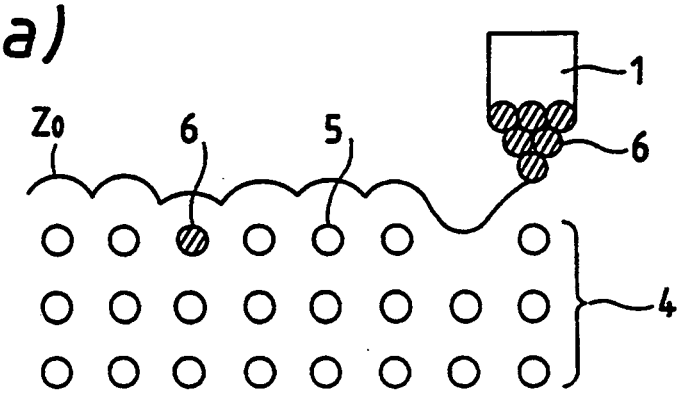
FIG. 8(b)
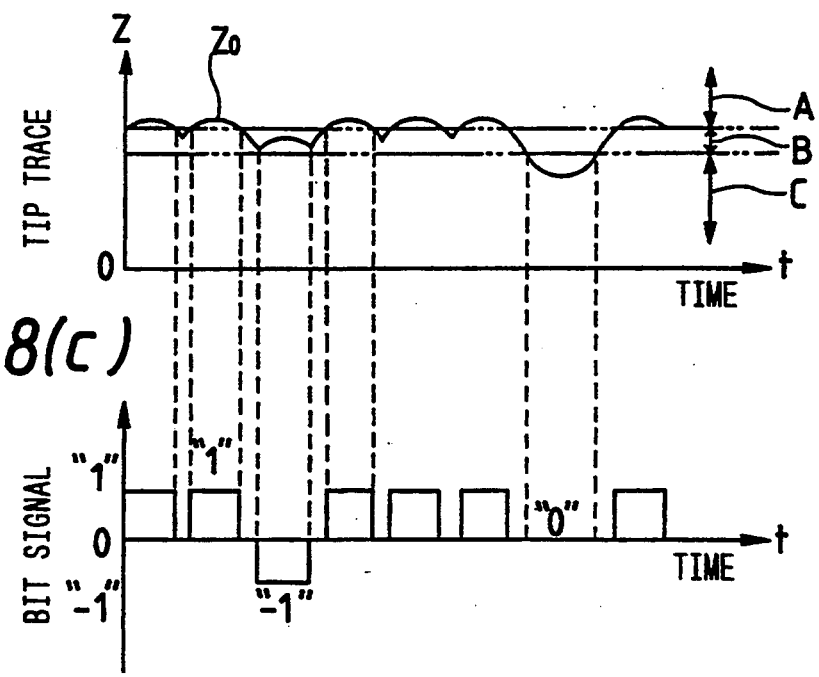
FIG. 8(c)

STM MODE

ATOMIC MANIPULATION MODE

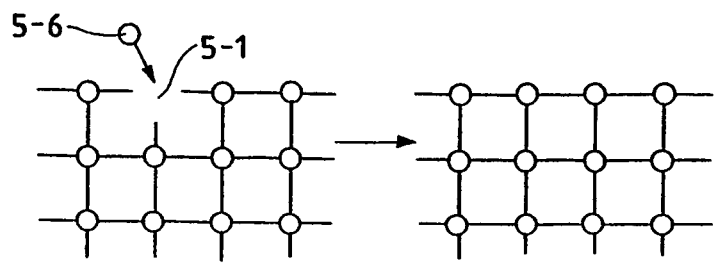
FIG. 18(a)
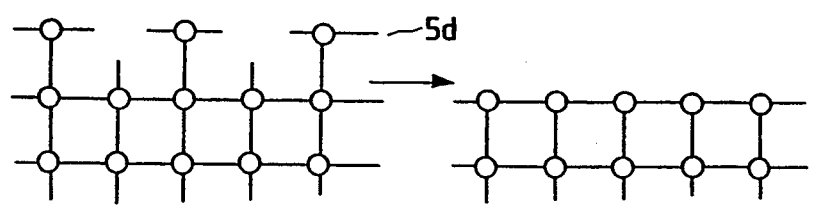
FIG. 18(b)
FIG. 19
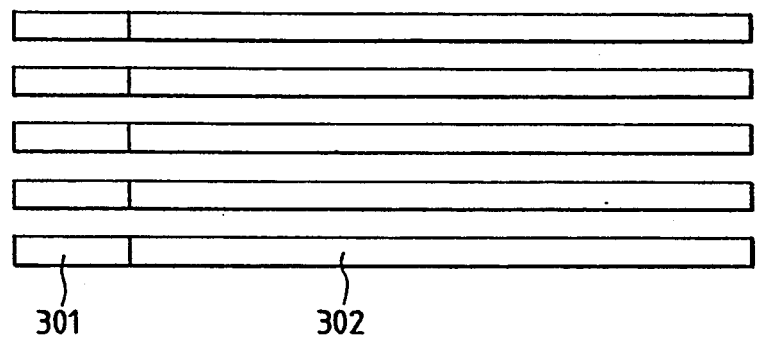

FIG. 20
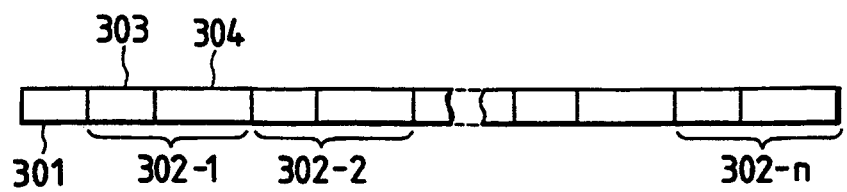
FIG. 21
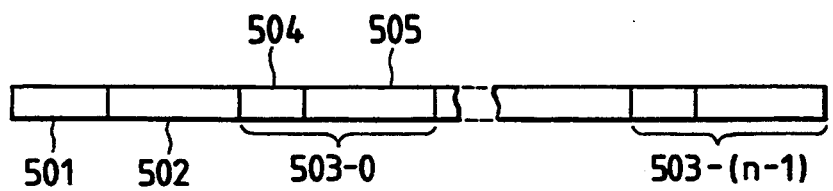
FIG. 22 (a)
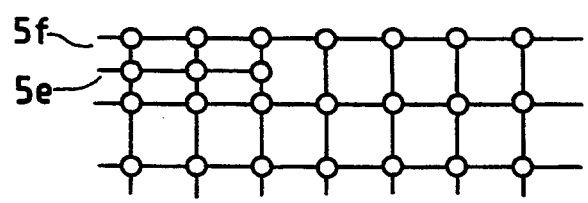
FIG. 22 (b)
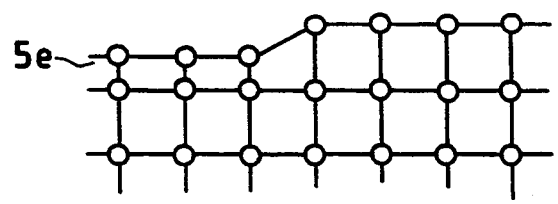

SURFACE ATOM FABRICATION METHOD AND APPARATUS

TECHNICAL FIELD

The present invention relates to a micro-fabrication method and apparatus for solid surfaces. In particular, this present invention relates to a new surface fabrication method and a most suitable apparatus configuration for implementing the method which allows a solid-device surface to be fabricated at an atomic scale so as to produce an ultra-fine device or a device for recording information at an ultra-high density.

BACKGROUND ART

In recent years, the information society has been growing at a remarkable pace, requiring the development of technologies that allow more information to be stored at a high density. At the present time, in the research and development field of semiconductor devices and file memories, transition to nanometer-scale and high-density products is taking place. In the future, technologies that make micro-fabrication and microrecording at an atomic scale possible will be in even greater demand.

A variety of technologies that make micro-fabrication and microrecording at an atomic scale possible have been proposed. Technologies that are regarded as having a bright prospect in the future include a technology utilizing an STM (Scanning Tunnelling Microscope) technique. It should be noted that the STM technology itself is disclosed in detail in the specification of U.S. Pat. No. 4,343,993.

An example of a fabrication/recording technique at an atomic scale that utilizes the STM technology is described on pages 524 to 526 of "NATURE" Vol. 344 (1990). In this technique, xenon atoms are dispersed and absorbed by a nickel surface held at an ultra-low temperature of 4° K. in an ultra-high vacuum environment. The dispersed and absorbed xenon atoms are then attracted one after another to the tip of an STM probe using the Van der Waal's force working between the STM probe and the xenon atoms, which migrate to a predetermined location on the nickel surface. By repeating this operation again and again, the xenon atoms are arranged along a predetermined character pattern, and the character pattern is then read by using the STM technique. Another example is described on pages 1312 to 1314 of "Appl. Phys. Lett." Vol. 55, No. 13 (1989). In this example, an STM probe is crashed into a specimen surface, mechanically drilling fine holes in order to implement fabrication and recording. The holes are then observed by using the STM technique.

In the case of the first example, however, in order to have xenon atoms absorbed by the nickel surface, it is necessary to put them in an ultra-high vacuum environment at an ultra-low temperature of 4° K. as cited above. Thus, this technique cannot be put to use in the atmosphere at room temperature. In addition, the technique has practically a large problem in that it takes a very long time to arrange xenon atoms along a predetermined character pattern. As for the second technique, since fabrication and recording are carried out by engraving holes mechanically on a specimen surface, it takes a very long time to perform the fabrication and recording. In addition, this technique also has a problem in that a hole with a dimension of the order of 5 nm which is larger in size than an atom may be engraved inadvertently. Accordingly, this technique is practically difficult to implement.

DISCLOSURE OF THE INVENTION

It is an object of the present invention to provide a new and original surface atom fabrication method and an apparatus thereof that can solve the problems of the conventional techniques described above.

That is to say, it is an object of the present invention to provide a surface atom fabrication method that allows atomic-scale surface fabrication to be performed in the atmosphere at room temperature.

It is another object of the present invention to provide a surface atom fabrication method that allows atomic fabrication to be performed at an atomic scale and at a high speed, and an apparatus for implementing the method.

In order to achieve the above objects, the present invention provides a surface atom fabrication method and an apparatus thereof which are described as follows.

The present invention provides a surface atom fabrication method characterized in that fabrication and recording are carried out at an atomic scale on the surface of a specimen, wherein:

a probe having a tip is installed, facing to the surface of a specimen to undergo fabrication and recording;

a voltage for forming an electric field is applied between the probe and the specimen;

the electric field is large enough to field-evaporate atoms constituting the specimen or the probe;

the electric field field-evaporates atoms constituting the specimen, removing them from the surface of the specimen; and as another alternative, the electric field field-evaporates atoms constituting the probe, depositing them on the surface of the specimen.

The present invention provides another surface atom fabrication method characterized in that fabrication and recording are carried out at an atomic scale on the surface of a specimen, wherein:

a probe having a tip is installed, facing to the surface of a specimen to undergo fabrication and recording;

a voltage for forming an electric field is applied between the probe and the specimen as described above the electric field has a magnitude that causes no changes in atomic arrangement on the surface of the specimen;

the position of the probe is then controlled in a direction perpendicular to the surface of the specimen in order to keep a constant tunnelling current flowing between the probe and the specimen;

while the position of the probe is controlled in this way, the surface of the specimen is scanned with the probe in a direction parallel to the surface of the specimen;

during the scanning, a pulsative voltage for forming an electric field is applied between the probe and the specimen;

this electric field is large enough to field-evaporate atoms constituting the specimen or the probe;

the electric field field-evaporates atoms constituting the specimen, removing them from the surface of the specimen; and as another alternative, the electric field field-evaporates atoms constituting the probe, depositing them on the surface of the specimen.

The present invention provides further another surface atom fabrication method characterized in that fabrication and recording are carried out at an atomic scale on the surface of a specimen, wherein:

a probe having a tip is installed, facing to the surface of a specimen to undergo fabrication and recording;

a voltage for forming an electric field is applied between the probe and the specimen as described above;

the electric field has a magnitude that causes no changes in atomic arrangement on the surface of the specimen;

the position of the probe is controlled in a direction perpendicular to the surface of the specimen in order to keep a constant tunnelling current flowing between the probe and the specimen;

while the position of the probe is controlled in this way, the surface of the specimen is scanned with the probe in a direction parallel to the surface of the specimen;

during the scanning, variations in position in the direction perpendicular to the specimen's surface of the scanning probe are obtained as image information using a scanning tunnelling microscope, the function of which is to display the profile of the specimen's surface as an image;

during the scanning, a negative pulsative voltage for forming an electric field is applied between the probe and the specimen;

this electric field is large enough to field-evaporate atoms constituting the specimen;

the electric field field-evaporates atoms constituting the specimen, removing them from the surface of the specimen;

as another alternative, during the scanning, a positive pulsative voltage for forming an electric field is applied between the probe and the specimen;

this electric field is large enough to field-evaporate atoms constituting the probe; and the electric field field-evaporates atoms constituting the probe, depositing them on the surface of the specimen.

The present invention provides still further another surface atom fabrication method characterized in that fabrication and recording are carried out at an atomic scale on the surface of a specimen, wherein:

a probe having a tip is installed, facing to the surface of a specimen to undergo fabrication and recording;

a voltage for forming an electric field is applied between the probe and the specimen as described above;

the electric field has such a magnitude that causes no changes in atomic arrangement on the surface of the specimen;

the position of the probe is controlled in a direction perpendicular to the surface of the specimen in order to maintain a constant tunnelling current flowing between the probe and the specimen;

while the position of the probe is controlled in this way, the surface of the specimen is scanned with the probe in a direction parallel to the surface of the specimen;

during the scanning, variations in position in the direction perpendicular to the specimen's surface of the scanning probe are stored;

the surface of the specimen is re-scanned along the scanning trace with the probe moved in a direction perpendicular to the specimen's surface in accordance with the stored variations;

during the re-scanning, a continuous or pulsative voltage for forming an electric field is applied between the probe and the specimen;

this electric field is large enough to field-evaporate atoms constituting the specimen or the probe;

the electric field field-evaporates atoms constituting the specimen, removing them from the surface of the specimen; and as another alternative, the electric field field-evaporates atoms constituting the probe, depositing them on the surface of the specimen.

The present invention provides still further another surface atom fabrication method characterized in that fabrication and recording are carried out at an atomic scale on the surface of a specimen, wherein:

a probe having a tip is installed, facing to the surface of a specimen to undergo fabrication and recording;

the position of the probe is controlled in a direction perpendicular to the surface of the specimen in order to keep a constant tunnelling current flowing between the probe and the specimen;

while the position of the probe is controlled in this way, the surface of the specimen is scanned with the probe in a direction parallel to the surface of the specimen;

during the scanning, a scanning trace in the direction perpendicular to the specimen's surface over a specific scanning area is stored;

the surface of the specimen is re-scanned along the scanning trace with the probe moved in a direction perpendicular to the specimen's surface in accordance with the stored scanning trace or in accordance with a modulated result of the stored scanning trace;

during the re-scanning, a continuous voltage for forming an electric field is applied between the probe and the specimen;

this electric field is large enough to field-evaporate atoms constituting the specimen or the probe;

the electric field field-evaporates atoms constituting the specimen, removing them from the surface of the specimen; and as another alternative, the electric field field-evaporates atoms constituting the probe, depositing them on the surface of the specimen. It should be noted that a negative voltage can be applied to the probe relative to the specimen in order to field-evaporate atoms constituting the specimen whereas a positive voltage can be applied to the probe relative to the specimen in order to field-evaporate atoms constituting the probe.

The fabrication and recording method at an atomic level provided by the invention has the following functions and effects:

The present invention provides a surface atom fabrication method with:

a probe having a tip, facing to the surface of a specimen to undergo fabrication and recording;

a strong electric field applied between the probe and the specimen, so that atoms existing on the surface of the specimen field-evaporate, departing therefrom; or as another alternative, atoms existing on the surface of the probe field-evaporate, depositing themselves on the tip of the specimen. By adopting a technique that can accomplish desired fabrication and recording on the surface of a specimen as described above, a fabrication and recording method at an atomic scale can be implemented with ease.

In addition, since the fabrication and recording method provided by the present invention is done on the surface of a specimen by field evaporation of atoms on the surface of the specimen or the tip of the probe, theoretically, fabrication and recording at an atomic scale can be implemented in the atmosphere at a room temperature.

Furthermore, according to the present invention, since fabrication and recording at an atomic scale can be done on a desired area of the surface of a specimen while the surface of the specimen is scanned with a probe using an STM technique, the speed of the fabrication and recording can be increased.

Moreover, according to the present invention, since fabrication and recording at an atomic scale can be done on the surface of a specimen while the surface of the specimen is observed with a probe using an STM technique, the fabrication and recording can be accomplished on a desired area of the surface of the specimen with a high degree of accuracy.

More characteristics as well as functions and effects based on the characteristics of the present invention other than those described above will become gradually obvious from detailed description of embodiments to be described later.

BRIEF DESCRIPTION OF THE DRAWINGS

FIG. 1a-b are is explanatory diagrams illustrating the principle of operation of a surface atom fabrication technique according to the present invention;

FIG. 3 schematically illustrates a probe employed in a surface atom fabrication technique, in conjunction with the time charts of FIGS. 3(a)-3(c)

FIG. 3(a)-(c) are time charts showing timing with which a fabrication voltage is applied to a probe employed in an embodiment implementing a surface atom fabrication technique in accordance with the present invention;

FIGS. 4($a_1$) and 4($b_1$) show probes operating according to the charts of FIGS. 4($a_2$)-($a_3$) and ($b_2$)-($b_3$)

FIGS. 4($a_2$)≧($a_3$) and ($b_2$)-($b_3$) are time charts showing relations between a scanning trace of a probe and a voltage applied to the probe in another embodiment implementing a surface atom fabrication technique in accordance with the present invention;

FIGS. 6(a)-(e) are explanatory diagrams illustrating the principle of operation of still other embodiments implementing a surface atom fabrication technique in accordance with the present invention;

FIGS. 7($a_1$)-($a_3$) and ($b_1$)-($b_3$) are collectively an explanatory diagram illustrating the principle of operation of still another embodiment implementing a surface atom fabrication technique by copying in accordance with the present invention;

FIGS. 8(a)-(c) are explanatory diagrams illustrating the principle of operation of still another embodiment implementing a surface atom fabrication technique allowing multiple recording in accordance with the present invention;

FIGS. 18(a) and (b) are explanatory diagrams illustrating a technique for eliminating recorded information adopted in the method for recording and retrieving information provided by the present invention;

FIG. 19 is an explanatory diagram illustrating recording tracks allocated on a recording medium employed in the method for recording and retrieving information provided by the present invention;

FIG. 20 is an explanatory diagram illustrating a typical detailed configuration of a recording track on a recording medium employed in the method for recording and retrieving information provided by the present invention;

FIG. 21 is an explanatory diagram illustrating another typical detailed configuration of a recording track on a recording medium employed in the method for recording and retrieving information provided by the present invention;

FIGS. 22(a) and (b) are explanatory diagrams illustrating a technique for restoring defects on a recording medium employed in the method for recording and retrieving information provided by the present invention;

BEST MODE FOR CARRYING OUT THE INVENTION

Figure 2:
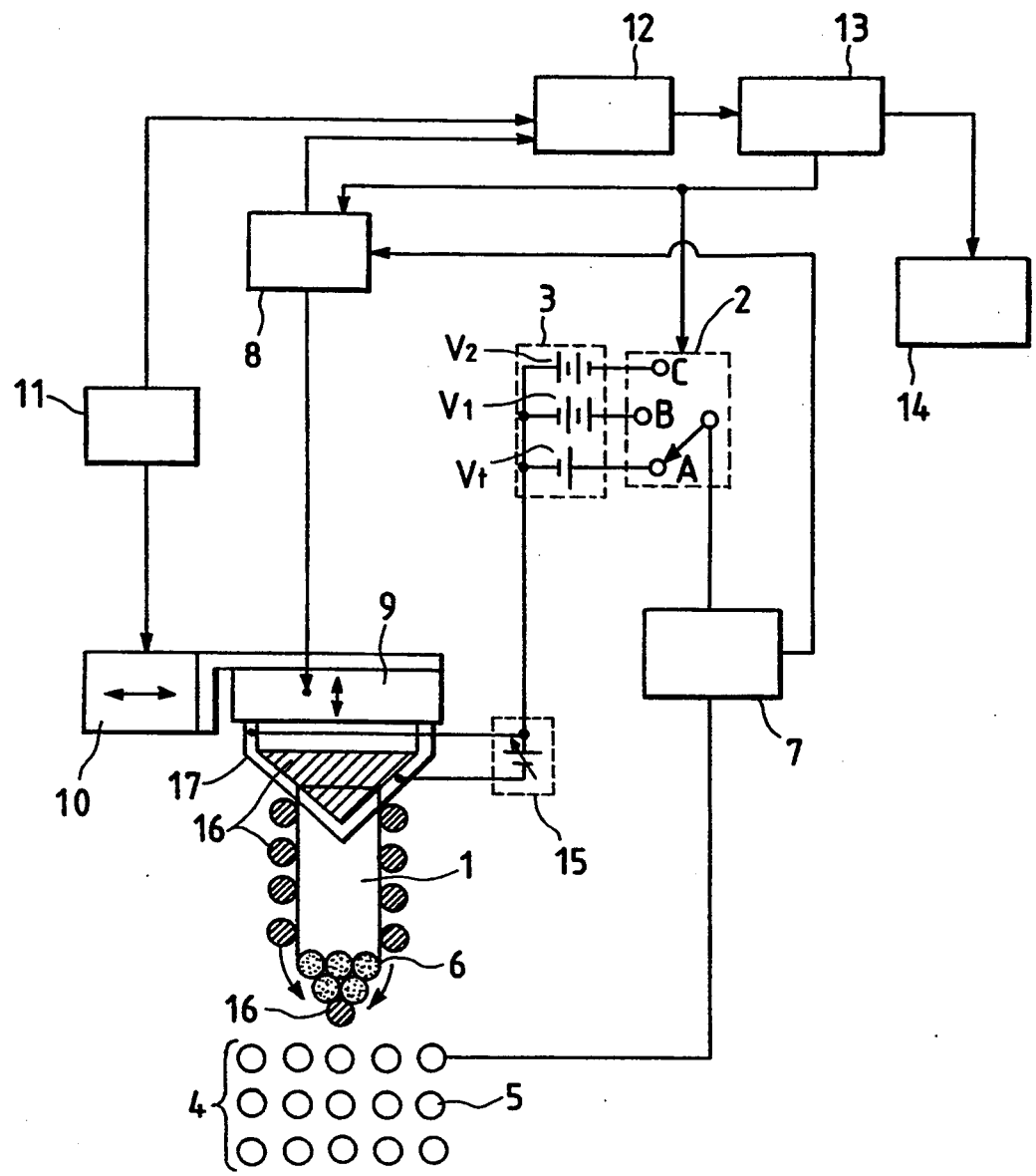
FIG. 2 is a schematic diagram showing the basic configuration of a surface atom fabrication apparatus provided by the present invention.

Hereafter, the surface atomic fabrication technique and apparatus provided by the present invention will be described in detail with reference to embodiments thereof shown in the accompanying diagrams.

First of all, the principle of operation of the fabrication and recording at an atomic scale implemented in the surface atom fabrication technique is explained by referring to FIG. 1.

As shown in the figure, a probe 1 is installed, with a tip thereof facing to the surface of a specimen 4. First of all, a tunnelling voltage Vt generated by a probe-voltage power supply 3 is applied to the probe 1 through a contact point A of a probe-voltage switch 2. It should be noted that the tunnelling voltage Vt has a magnitude that causes no changes in atomic arrangement on the surface of the specimen 4. Then, the surface of the specimen 4 is scanned with the probe 1 driven by a plane-direction scanning means 10 along a plane parallel to the surface.

In the meantime, a tunnelling current (It) flowing between the scanning probe 1 and the specimen 4 is measured by a tunnelling-current detecting circuit 7. The position of the probe 1 is adjusted in a direction perpendicular to the surface of the specimen 4 by means of a perpendicular-direction servocontrol circuit 8 and a perpendicular-direction position controlling means 9 in order to keep the tunnelling current (It) at a constant value.

At a point in the scanning process, the probe 1 is held at a position in the perpendicular direction and then the probe-voltage switch 2 is switched over from the contact point A to a contact point B, applying a negative voltage $V_1$ generated by the probe-voltage power supply 3 to the probe 1. The negative voltage $V_1$ generates an electric field between the tip of the probe 1 and the surface of the specimen 4. The electric field has an intensity that is large enough to field-evaporate an atom 5 from the surface of the specimen 4.

The value of the intensity is estimated to be approximately 1 V/Å or greater, and is set to such a value that only a single atom 5 right below the tip of the probe 1 is field-evaporated. That is to say, the electric-field intensity does not field-evaporate atoms from surrounding areas on the surface of the specimen 4. In this way, only atoms right below the tip of the probe 1 can be selectively eliminated from the surface of the specimen 4 by a field-evaporation process.

By using this field-evaporation phenomenon of atoms on the surface of a specimen, any individual atom can be selected arbitrarily for removal and, hence, for elimination from the surface of the specimen. This elimination process is shown in FIG. 1 (a). Then, by performing the field evaporation operation on any arbitrary plurality of points on the surface of the specimen in the course of the scanning process with the probe 1, atoms are field-evaporated from points, and desired pattern can thus be fabricated or recorded.

In addition, in the course of the scanning process with the probe 1, the probe-voltage switch 2 can be switched over to a contact point C, applying a positive voltage $V_2$ generated by the power supply 3 to the probe 1. The positive voltage $V_2$, in turn, generates an electric field that has an intensity large enough to field-evaporate an atom 6 from the tip of the probe 1. In this case, unlike the electric field generated by the negative voltage $V_1$ described above, it is an atom 6 on the tip of the probe 1 that is field-evaporated instead of a specimen-surface atom 5. The atom 6 field-evaporated from the tip of the probe 1 is attracted by the surface of the specimen 4, sticking to a position on the surface of the specimen 4 closest to the tip of the probe 1 or filling an empty atomic position on the surface of the specimen 4 left by a field-evaporated atom 5. In this way, an individual probe-tip atom 6 can be stuck to an arbitrary position on the surface of the specimen 4 as shown in FIG. 1 (b).

As described above, the surface atom fabrication technique provided by the present invention makes use of the effects of the field-evaporation phenomenon of an atom 5 on the surface of a specimen 4 or an atom 6 on the tip of the probe 1. Accordingly, the operations for implementing the surface atom fabrication can all be done in the atmosphere at an ambient temperature. With this technique, practical fabrication and recording at an atomic scale can thus be realized for the first time.

FIG. 2 is a schematic diagram showing the basic configuration of a surface atom fabrication apparatus provided by the present invention. As shown in the figure, a probe 1 is installed. With a tip thereof facing to the surface of a specimen 4. First of all, a tunnelling voltage Vt generated by a probe-voltage power supply 3 is applied to the probe 1 through a contact point A of a probe-voltage switch 2. Note that the tunnelling voltage Vt has a magnitude that causes no changes in atomic arrangement on the surface of the specimen 4.

The surface of the specimen 4 is then scanned with the probe 1 which is driven by an XY scanning circuit 11 and a plane-direction scanning means 10 along a plane parallel to the surface. In the meantime, a tunnelling current (It) flowing between the scanning probe 1 and the specimen 4 is measured by a tunnelling-current detecting circuit 7.

The position of the probe 1 is adjusted in a direction perpendicular to the surface of the specimen 4 by means of the perpendicular-direction servo control circuit 8 and the perpendicular-direction position controlling means 9 in order to keep the tunnelling current (It) at a constant value. At that time, the position of the probe 1 in the perpendicular direction shown in FIGS. 3 and 3(a) is are stored in a storage unit 12 for all points scanned by the probe 1 during the plane-direction scanning operation. The perpendicular-plane positions are also displayed on an image display unit 14 by a control computer 13 as a topographic image at an atomic scale which is also known as an STM image, a positional-distribution image of the probe 1 in the perpendicular direction in two dimensions.

In the course of the process of performing the STM operations, a pulsative fabrication voltage $V_1$ is applied to the probe 1 with the timing shown in FIG. 3 (b). To be more specific, at a point on the surface of the specimen 4, the control computer 13 transmits a control signal to the perpendicular-direction servo control circuit 8 and the probe-voltage switch 2 in order to switch over the switch 2 to the contact point B after holding the probe 1 at its current position in the perpendicular direction. With the probe-voltage switch 2 set at the contact point B, the negative pulsative fabrication voltage $V_1$ is applied to the probe 1. The voltage $V_1$ has a magnitude greater than a threshold voltage $V_{th}$ required for the field evaporation of an atom 5 right below the tip of the probe 1 from the surface of the specimen 4, but must be within such a range that atoms 5 at surrounding areas do not thereby field-evaporate from the surface of the specimen 4. This operation allows a single atom 5 to be field-evaporated from any arbitrary point on the surface of the specimen 4 and, hence, to be eliminated therefrom. Note that it is desirable to set the time duration of the applied pulsative voltage, also known as a pulse width, to a value smaller than a time it takes for the probe 1 to scan an area occupied by an atom 5 on the surface of the specimen 4. In concrete terms, it will be desirable to set the pulse width to one second or smaller.

Also in the course of the process of observing a topographic image or an STM image, a positive pulsative voltage $V_2$ is applied to the probe 1 with the timing shown in FIG. 3 (b). To be more specific, at a point on the surface of the specimen 4, the control computer 13 transmits a control signal to the perpendicular-direction servo control circuit 8 and the probe-voltage switch 2 in order to switch over the switch 2 to the contact point C after holding the probe 1 at its current position in the perpendicular direction. With the probe-voltage switch 2 set at the contact point C, the positive pulsative fabrication voltage $V_2$ is applied to the probe 1. The voltage $V_2$ has a magnitude greater than an evaporation voltage $V_{ev}$ required for the field evaporation of an atom 6 from the tip of the probe 1, but must be within such a range that surrounding atoms 6 do not thereby field-evaporate. This operation allows a single atom to be field-evaporated from the tip of the probe 1 and to stick to an arbitrary point on the surface of the specimen 4.

In addition, in the course of the scanning process by the probe 1, a negative pulsative voltage $V_1$ and a positive pulsative voltage $V_2$ are applied to the probe 1 with the timing shown in FIG. 3(c). As shown in the figure, with the probe 1 held at its current position in the perpendicular direction, the negative pulsative voltage $V_1$ is first applied to the probe 1 to be followed immediately by the positive pulsative voltage $V_2$ for field-evaporating a specimen-surface atom 5 and a probe-tip atom 6 respectively. This operation field-evaporates the atom 5, eliminating it from a position right under the tip of the probe 1 and, right after the elimination of the atom 5, fills the now-empty atomic position on the surface of the specimen 4 with the atom 6. In other words, the operation allows the specimen atom 5 to be replaced by the probe atom 6.

Further, by providing a mechanism for supplying material 16 having atoms that are different from that of the probe 1 itself on the tip thereof as shown in FIG. 2, it is possible to supply the surface of the specimen 4 with the atoms of the material 16. As shown in the figure, the material 16 which is different from the probe composition material is kept in an atmospheric space enclosed by a heater 17. With a probe-heater power supply 15 turned on, the supply material 16 and the probe 1 are heated. The supply material 16 diffuses into the surface of the probe 1, supplying atoms to the tip thereof. In this state, by placing the probe 1 at a position facing to the surface of the specimen 4 and then applying a positive voltage for field-evaporating an atom from the probe 1, an atom of the supply material 16 diffused into the tip of the probe 1 is field-evaporated therefrom, depositing on the surface of the specimen 4. Thus, this technique allows atoms of a supply material of a selected type to be provided to the surface of a specimen.

The operation described above allows atoms to be eliminated from the surface of a specimen and a variety of atoms to be stuck on or filled into the surface. The elimination and sticking of atoms from and on a specimen surface, in turn, allow fabrication and recording to be performed thereon with ease and a high degree of accuracy.

Next, another embodiment implementing a surface atom fabrication technique in accordance with the present invention is described by referring to FIGS. 2, 4($a_1$)–($a_3$) and ($b_1$)–($b_3$). In the apparatus configuration of the embodiment shown in FIG. 2, first of all, a tunnelling voltage Vt is applied to a probe 1. The tunnelling voltage Vt has a value of such an order that the atomic arrangement on the surface of a specimen 4 is not affected. A specific area on the surface of the specimen 4 is then scanned with the probe 1. A track $Z_0$ traced by the tip of the probe 1 in a direction perpendicular to the surface during the scanning operation shown in FIGS. 4($a_1$)–($a_3$) is stored. Then, a negative voltage $V_1$ is applied to the probe 1 in order to generate an electric field large enough for field-evaporating an atom 5 from the surface of the specimen 4, and the probe 1 is controlled so that the tip thereof re-traces the same scanning track $Z_0$ stored before in order to re-scan the same specific area as shown in FIGS. 4($b_1$)–($b_3$). During the re-scanning operation, atoms 5 can be field-evaporated and, thus, eliminated continuously from the specific area on the surface of the specimen 4.

In the case of the embodiment shown in FIG. 3, since a fabrication pulsative voltage $V_1$ is applied once at a time for each of a plurality of scanned points on the surface of the specimen 4, it takes a long time to perform the fabrication. In the case of this embodiment, however, a fabrication voltage $V_1$ is applied continuously for a plurality of contiguous points. Accordingly, the fabrication can be carried out continuously with the voltage $V_1$ applied as it is. As a result, surface fabrication at an atomic scale can be performed at a high speed.

It should be noted that a positive voltage $V_2$ can also be applied to the probe 1 continuously to field-evaporate atoms 6 from the tip of the probe 1. In this way, continuous fabrication can be accomplished on the surface of the specimen 4 at an atomic scale as in the case of the negative voltage $V_1$.

Figure 5:
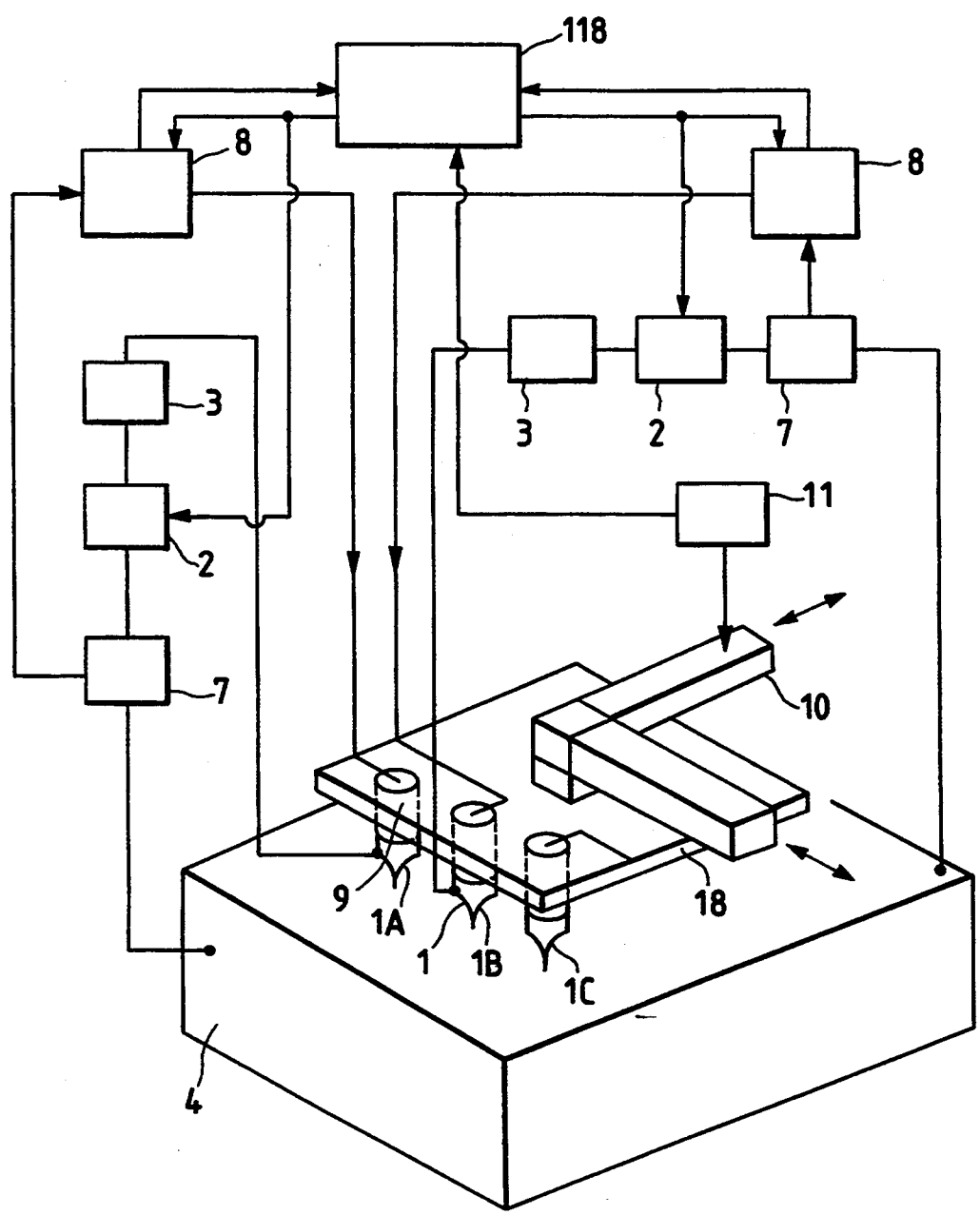
FIG. 5 is an explanatory diagram illustrating the principle of operation of yet another embodiment implementing a surface atom fabrication technique employing a plurality of probes in accordance with the present invention.

FIG. 5 shows another embodiment of the present invention. In this embodiment, a plurality of probes 1 are attached to a probe holding plate 18. In this configuration, driven by a single common plane-direction scanning means 10, the probes 1 altogether sweep along a plane parallel to the surface of a specimen 4, scanning the specimen 4. Each of the probes 1 is individually provided with a perpendicular-direction position controlling means 9, a probe-voltage switch 2 and a probe-voltage generating power supply 3. These components operate in the same way as those shown in FIGS. 3 and 4.

A control computer 118 serves as a common control means, outputting control signals for controlling voltages applied to the probes and positions in a direction perpendicular to the surface of the specimen at which the probes are to be held at that time. The control means 118 can be regarded as a component corresponding to the control computer 13 shown in FIG. 2. Accordingly, with this configuration, fabrication at an atomic scale can be performed on the surface of a specimen 4 using a plurality of probes 1 simultaneously with each probe 1 moving along a scanning line different from others. As a result, the speed of the fabrication is increased proportionally to the number of probes 1 in use. In this case, patterns formed by fabrication using the probes 1 can be different from each other or identical for all the probes 1. The latter is applicable to a case in which a large number of identical recording patterns are to be fabricated.

Figure 6A:
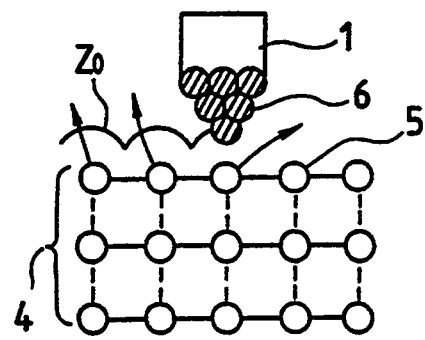
Figure 6B:
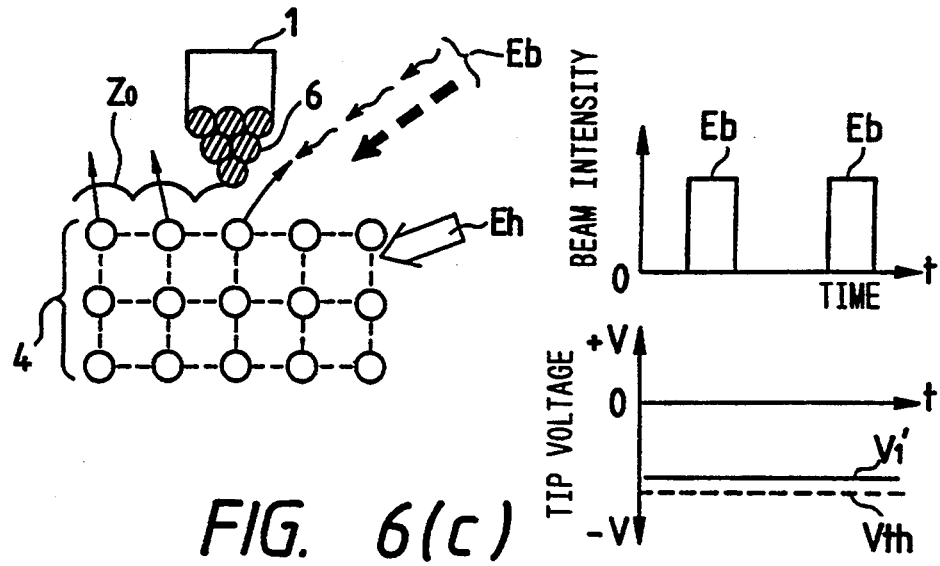
Figure 6C:
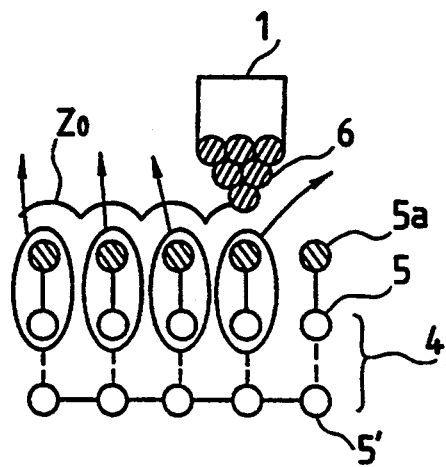

FIG. 6 shows still another embodiment of the present invention. The embodiment shown in FIG. 6 relates to material qualities of a specimen surface that are suitable for fabrication using a surface atom fabrication technique by field evaporation in accordance with the present invention.

Depending upon the material quality of a specimen surface, in some cases, it is difficult to field-evaporate atoms from the specimen surface due to a strong binding force among the atoms constituting the specimen surface, or conversely, it is quite within the bounds of possibility that the binding force is weak so that a plurality of specimen-surface atoms forming a cluster can be field-evaporated with ease. At any rate, by using a layer material such as molybdenite or graphite as the specimen 4 shown in FIG. 6 (a), this problem can be solved. That is to say, since it is Van der Waal's force that binds atomic layers of the layer material, their binding force is extremely weak. Therefore, only an atom right below the tip of a probe 1 can be field-evaporated with ease and it is thus possible to eliminate atoms one after another or to remove layers of atoms in layer units easily from the surface of the specimen 4.

As for a strong binding force, in order to weaken the binding force among atoms constituting the specimen 4 or the probe 1, an external excitation beam Eb such as light, an X-ray, electrons, ions, neutrons and protons with energy exceeding the thermal energy Eh is applied to the surface of the specimen 4 or the probe 1 either continuously or in the form of pulses as shown in FIGS. 6($b$) and 6($d$). The external excitation beam Eb facilitates the field evaporation of atoms from the surface of the specimen 4 or the tip of the probe 1.

In addition, when a negative voltage $V_1'$ smaller in magnitude than the threshold voltage $V_{th}$ required for field-evaporating an atom from the surface of the specimen 4 is applied to the probe 1 (FIG. 6(3)), applying a pulsative external excitation beam Eb to the surface of the specimen 4 will cause field evaporation of specimen-surface atoms to occur only during a period of time coinciding with the external excitation pulse. Likewise, when a positive voltage $V_2'$ smaller than an evaporation voltage $V_{ev}$ required for field-evaporating an atom from the tip of the probe 1 is applied to the probe 1, applying a pulsative external excitation beam Eb to the tip of the probe 1 will cause field evaporation of probe-tip atoms to occur only during a period of time coinciding with the external excitation pulse. Further, with an atomic layer $5a$ absorbed by the surface of the specimen 4 and with the atomic layer $5a$ made of a material having a marvelous property of weakening the binding force between an atomic layer 5 constituting the topmost surface of a specimen 4 and an atomic layer $5'$ beneath the layer 5, it is possible to field-evaporate an atom from the absorbed atomic layer $5a$ and an atom from the topmost layer 5 absorbing the atomic layer $5a$ as a pair as shown in FIG. 6($c$). In this way, even in the case of a specimen with a strong binding force among atoms, it becomes quite possible to remove specimen-surface atoms one after another or in layer units with ease. For example, in the case of a specimen 4 made up of silicon single crystals, chlorine, bromine and their compounds can be regarded as usable materials to be absorbed as described above.

FIGS. 7($a_1$)—($a_3$) and ($b_1$)–($b_3$) collectively show still another embodiment of the present invention. The embodiment relates to a technique for copying a topographical state of a specimen surface 4A which has undergone surface fabrication at an atomic scale to another specimen surface 4B not having undergone fabrication. A tunnelling voltage Vt is applied to probes 1A and 1B for scanning the specimen surfaces 4A and 4B respectively in accordance with the so-called STM technique in the apparatus configuration shown in FIG. 5. It should be noted that the tunnelling voltage Vt has a magnitude in a range which does not change the atomic arrangements of the specimen surfaces 4A and 4B.

As an area Sa on the specimen surface 4A with no specimen atom 5A existing is detected by the probe 1A, a detection signal is immediately transmitted to a perpendicular-direction servo control circuit 8 and a probe-voltage switch 2 of the probe 1B. The detection signal requests the perpendicular-direction servo control circuit 8 to hold the probe 1B and then causes a pulsative negative voltage $V_1$ to be applied to the probe 1B. The voltage $V_1$ is large enough for generating an electric field required for the field evaporation of an atom 5B on the specimen surface 4B. The probe 1B, with the voltage $V_1$ applied thereto, field-evaporates and, hence, eliminates a specimen atom 5B from an area Sb on the specimen surface 4B corresponding to the area Sa on the specimen surface 4A. This operation allows a topographic state to be copied with a high degree of accuracy from the specimen surface 4A to the specimen surface 4B at an atomic scale. In this copying technique, two or more probes 1B on the copying side can be used to accomplish exactly the same function. Accordingly, by employing more probes 1B, as many copies as probes 1B can be obtained. As a result, the copying performance is enhanced.

FIG. 8 shows still another embodiment of the present invention. This embodiment relates to a technique for storing information at an atomic scale by utilizing the surface atom fabrication method provided by the present invention. It should be noted that since the information is recorded in a way that has already been described, the following description focuses on a technique to detect stored information.

In this embodiment, a tunnelling voltage Vt is applied to a probe 1. It should be noted that the tunnelling voltage Vt has a magnitude in a range which does not change the atomic arrangement of the surface of a specimen 4. The position of the probe 1 is adjusted in a direction perpendicular to the surface of the specimen 4 so that a tunnelling current flowing between the probe 1 and the specimen 4 is always kept at a constant value.

While the tunnelling current is controlled as such, an area on the surface of the specimen 4 which has undergone surface fabrication, information recording in this case, is scanned with the probe 1. As the probe 1 passes over a spot occupied by an atom of a type different from the specimen-composition atom 5 inherently existing on the surface of the specimen 4, the tunnelling current becomes smaller than the value with the probe 1 located above a specimen-composition atom 5 because the present atomic state at this area differs from others. An example of an atom that is different from the specimen-composition atom 5 is a probe-composition atom 6.

In order to keep the tunnelling current constant, the probe 1 approaches the surface of the specimen 4, lowering its perpendicular-direction track $Z_0$. At an area where a specimen-surface atom 5 is missing, the perpendicular-direction track $Z_0$ of the probe 1 is further lowered. Variations in perpendicular-direction track $Z_0$ of the probe 1 are then detected to represent areas classified into three categories A, B and C shown in FIG. 8 (b). When the probe 1 is positioned above the area A, B or C for a period of time longer than a predetermined duration, the corresponding perpendicular-direction track $Z_0$ is detected as a bit signal having a value of 1, $-1$ or 0 to represent the area A, B or C respectively as is shown in FIG. 8 (c). In this way, multiple recording and its detection at an atomic scale can be implemented. Note that recording and retrieval of binary information can also be carried out as well.

Figure 9:
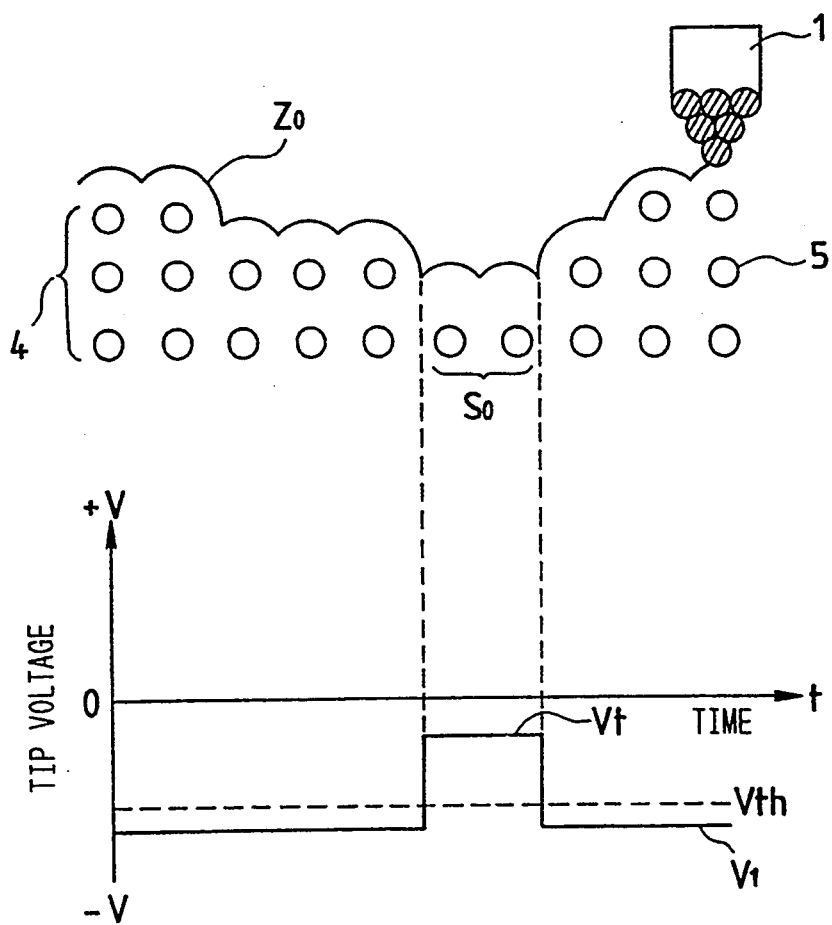
FIG. 9 is an explanatory diagram illustrating the principle of operation of still another embodiment implementing a surface atom fabrication technique for flattening a surface in accordance with the present invention.

FIG. 9 shows still another embodiment of the present invention. This embodiment relates to a technique for obtaining a flat surface at an atomic level. To be more specific, the lowest portion of the surface of a specimen 4 is taken as a reference. By using the specimen-surface fabrication technique shown in FIG. 4, all specimen atoms above the reference are field-evaporated and, hence, eliminated from the surface of the specimen 4 to produce a flat surface.

First of all, the surface of the specimen 4 is scanned with the probe 1 in accordance with the STM technique. The track $Z_0$ of the scanning probe 1 is stored and then a negative voltage $V_1$ is applied to the probe 1. The negative voltage $V_1$ has a magnitude large enough for field evaporation of a specimen-surface atom 5. The entire surface of the specimen 4 is scanned again by moving the probe 1 along the stored track $Z_0$. At that time, the voltage Vt applied to the probe i is lowered so as to field-evaporate no specimen-surface atoms 5 from the lowest portion $S_0$ on the surface of the specimen 4. In this way, a layer of atoms on the topmost surface of the specimen 4 can be field-evaporated and, hence, eliminated therefrom except for the lowest portion $S_0$ of the surface.

Then, the same operation is repeated as many times as required to field-evaporate and strip off atoms from the surface of the specimen 4 layer after layer. Finally, a flat specimen surface at an atomic level is obtained with the lowest portion $S_0$ of the original specimen surface becoming the topmost surface. The new specimen surface which has been flattened at an atomic level can be utilized as a clean surface to undergo further surface fabrication such as information recording. That is to say, the technique adopted in this embodiment can be used, as it is, as a method for erasing stored information.

Figure 10A:
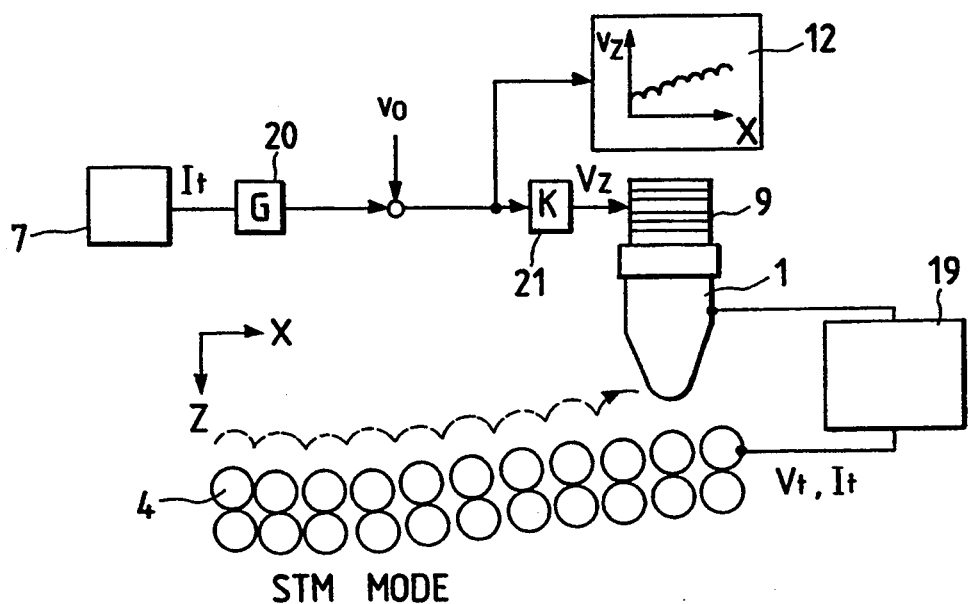
FIGS. 10(a) and (b) are explanatory diagrams illustrating the principle of operation of still another embodiment implementing a surface atom fabrication apparatus in accordance with the present invention.
Figure 10B:
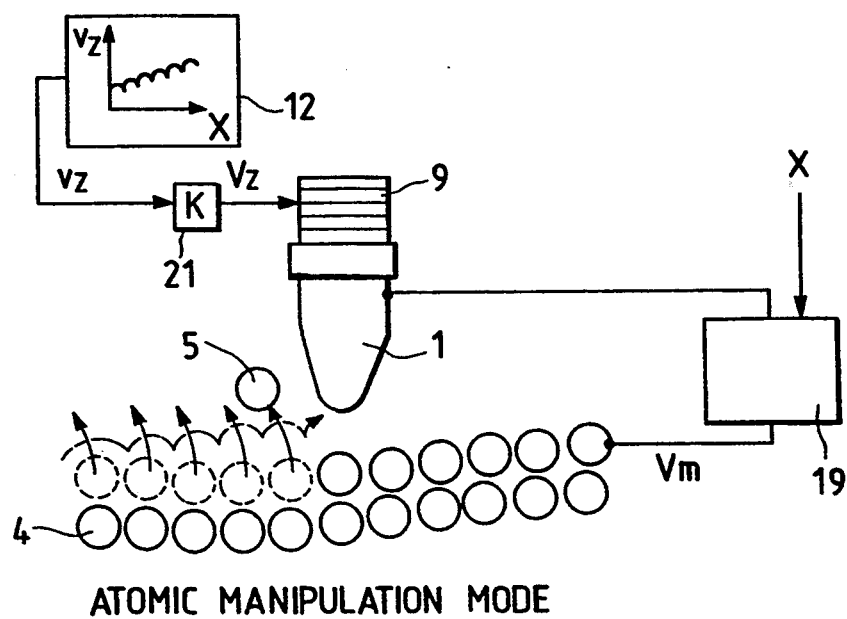

FIG. 10 shows still another embodiment of the surface atom fabrication technique. The fabrication procedure adopted by this embodiment is implemented in an STM mode shown in FIG. 10 (a) and an atomic manipulation mode shown in FIG. 10 (b). In the STM mode, the profile of the surface of a specimen 4 is measured by using the apparatus configuration of an STM (Scanning Tunnelling Microscope) and operating the apparatus as an STM. In the atomic manipulation mode, surface atoms of a specimen 4 are manipulated by moving a probe 1 in accordance with a measured profile.

As shown in FIG. 10 (a), a voltage Vt is applied by a voltage control circuit 19 to a probe 1 to flow a tunnelling current (It) between the surface of a specimen 4 having a regular atomic arrangement and the probe 1. The magnitude of the tunnelling current (It) is measured by a tunnelling-current detecting circuit 7 while the probe 1 is moved in an X direction. The detected magnitude is converted into a voltage signal by a current-to-voltage conversion circuit 20.

The position of the probe 1 in the Z direction is adjusted by a Z-direction driving mechanism 9 so that a voltage output by the current-to-voltage conversion circuit 20 remains at a constant value $V_0$. In this way, the profile of the specimen surface is measured in the STM mode. During the profile measurement in the STM mode, variations $V_2$ in position in the Z direction of with changes in the X direction of the probe 1, that is, the track in the Z direction of the probe 1 is stored in a memory unit 12.

As shown in FIG. 10 (b), in the atomic manipulation mode, the track in the Z direction of the probe 1 stored in the memory unit 12 is supplied to the Z-direction driving mechanism 9 while the probe 1 is moved in the X direction. In this way, the position of the probe 1 is controlled in the Z direction so that the probe 1 traces the track in the Z direction with a high degree of fidelity. At that time, a voltage Vm required for the fabrication of the specimen surface at an atomic level is applied between the probe 1 and the specimen 4 by the voltage control circuit 19. During the fabrication of the specimen surface at an atomic level, the tunnelling current (It) is not measured. Accordingly, the function of the control mechanism for keeping the tunnelling current (It) at a constant value is disabled.

As a result, the probe 1 moves according to the stored Z-direction track, scanning the specimen surface with the gap between the probe 1 and specimen-surface atoms kept at a fixed value. Accordingly, since a voltage required by the scanning probe 1 for the fabrication of the specimen surface at an atomic level can be applied to the probe 1, the specimen-surface fabrication can be done at a a high speed.

In the case of this embodiment, however, since the surface-measurement and surface-fabrication processes are done separately, there may be a problem in that the atomic arrangement changes during the time interval between the two processes. In order to prevent the atomic arrangement from changing, variations in temperature which are the cause of such a change are suppressed by typically providing a specimen-temperature controlling mechanism for keeping the temperature of the specimen 4 at a constant value. In addition, in order to avoid changes in quality of the atomic arrangement caused by contamination of the specimen 4, it is recommended that the specimen 4 be fabricated by holding it in a vacuum environment.

Figure 11:
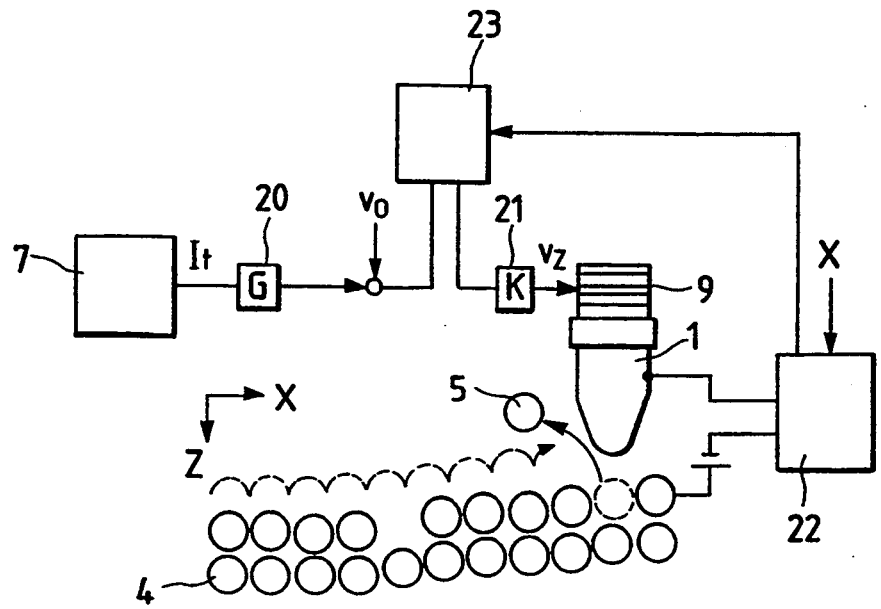
FIG. 11 is an explanatory diagram illustrating the principle of operation of still further another embodiment implementing a surface atom fabrication apparatus in accordance with the present invention.

FIG. 11 shows an embodiment which allows the STM surface-measurement and surface-fabrication processes at an atomic level to be carried out at the same time. When a probe 1 reaches a predetermined position on a sample surface corresponding to a parallel-direction scanning quantity X of the probe 1 in the normal STM measurement of the surface at an atomic level, a voltage required for the fabrication of the specimen surface at an atomic level is generated by a voltage controlling circuit 22. In order to fabricate the surface in atomic units, to keep the gap between the specimen 4 and the probe 1 at a fixed value and to perform the fabrication steadily, it is necessary to apply the voltage for the fabrication of the surface at an atomic level for a duration shorter than the time it takes for the probe 1 to scan an area occupied by one atom. With the configuration described above, however, the position of the probe 1 cannot be controlled in the Z direction because the voltage required for the fabrication of the specimen surface at an atomic level has a value different from a voltage for keeping a tunnelling current constant. Therefore, a voltage holding circuit 23 is provided in order to hold a control signal supplied to a Z-direction driving mechanism 9 for driving the probe 1 in a direction perpendicular to the surface of the specimen 4. In such a configuration, the surface of a specimen can be fabricated at an atomic level simultaneously during STM measurement. Accordingly, the fabrication can be done in atom units within a practically acceptable time.

This embodiment is meritorious in that the fabrication is not effected by a variation in atomic arrangement because there is no difference in time between the measurement and the fabrication. Moreover, in the embodiments described so far, a voltage is applied to produce an electrical effect on the fabrication of the surface of a specimen at an atomic level. However, the concept of the embodiments allows a current, instead of a voltage, to be flowed to give the same electrical effect.

Figure 12:
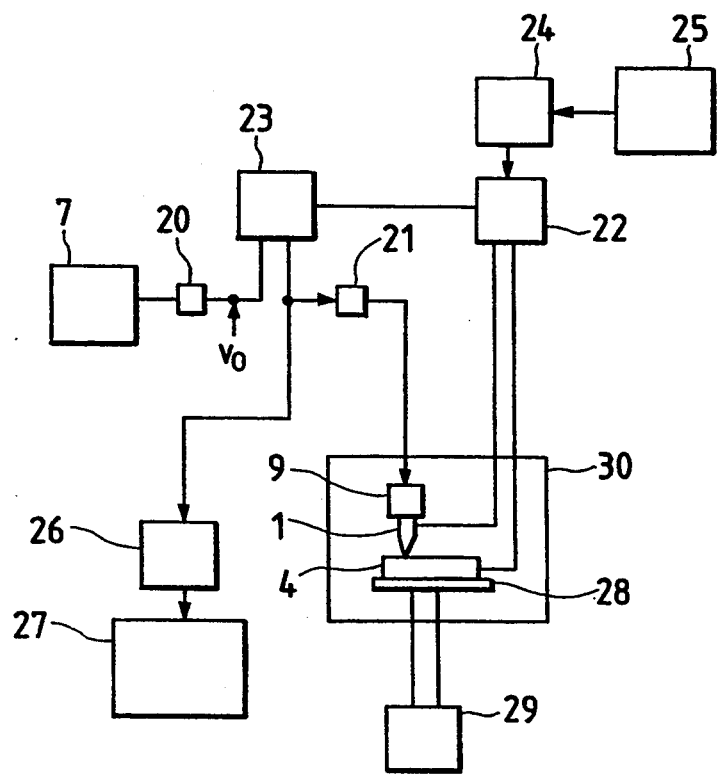
FIG. 12 is an explanatory diagram illustrating the principle of operation of an atomic memory apparatus utilizing the surface atom fabrication technique provided by the present invention.

FIG. 12 shows the fundamental configuration of an atomic memory apparatus making use of the surface atom fabrication technique shown in FIG. 11. A specimen 4 having a regular atomic arrangement is fixed on a specimen holder 18 for controlling the temperature of the specimen 4. The holder 28 is kept at a fixed temperature by a temperature controlling circuit 29 in order to suppress variations in temperature on the specimen 4. In this way, changes in distance from an atom to another due to variations in temperature are avoided.

The specimen 4, the holder 28, a probe 1 and a probe driving mechanism 9 are installed in a vacuum chamber 30. The vacuum chamber 30 is used for avoiding contamination of the specimen 4.

Data are written and read into and from the specimen 4 having a stable atomic arrangement as follows. Data to be written, which are output by a write-data control apparatus 25, are converted into an atomic-array signal by a write-data conversion circuit 24 before being written into the surface of the specimen 4 by the surface atom fabrication apparatus shown in FIG. 11. On the other hand, data written into the surface of the specimen 4 are read by STM measurement of the surface. Information on the atomic arrangement obtained from the STM measurement is converted into a digital signal by a data conversion circuit 26 before being transferred to a data control circuit 27. Even though this embodiment employs the apparatus configuration shown in FIG. 11, the one shown in FIG. 10 can also be used as well.

As described above, this embodiment has been explained as an apparatus configuration which can be used for both reading and writing. It is needless to say, however, that the embodiment can also be used as an apparatus configuration dedicated for either reading or writing only.

Next, prospective applications of the surface atom fabrication technique provided by the present invention are described.

Since the surface atom fabrication provided by the present invention allows the surface of a specimen to be fabricated in atom units, a first possible application is high-density recording. The following is a description of application examples in actual terms in the field of high-density recording.

Figure 13:
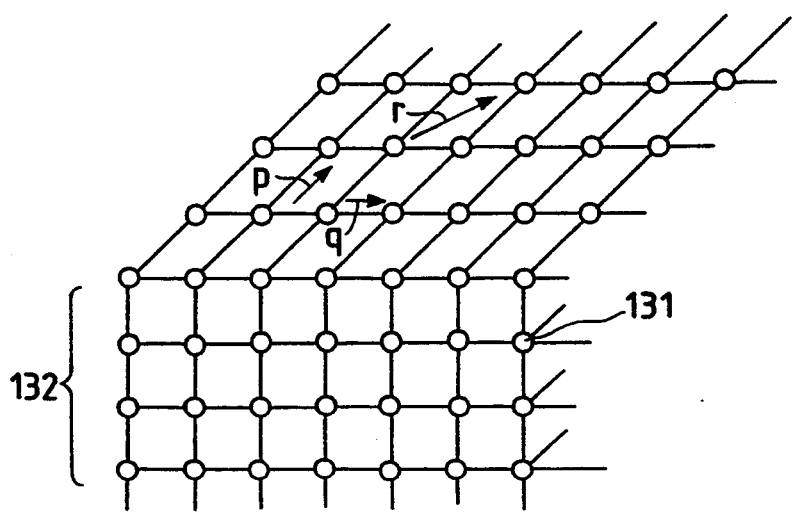
FIG. 13 is an explanatory diagram illustrating setting directions of recording tracks in a technique for recording and retrieving information provided by the present invention.

FIG. 13 is an explanatory diagram of a technique for storing information along an atomic arrangement on a surface of crystals (100) having simple cubic lattices used as a recording medium. The figure shows the atomic arrangement of the simple cubic lattices in which reference numerals 131 and 132 denote an atom and a simple cubic lattice respectively. In this example, information is recorded on a track in a recording direction (010) denoted by an arrow p in the figure. An adjacent track is separated away from a recording track in a direction (001) denoted by an arrow q in the figure. In other words, a recording track is scanned in the direction (010) whereas scanning across recording tracks is performed in the direction (001). In this example, two-dimensional scanning in the two directions (010) and (001) is adopted in recording unit translation vectors of a two-dimensional tetragonal system of the recording surface. Note, however, that a combination with another vector formed by linear combination of unit translation vectors can also be adopted as a scanning direction.

Figure 14:
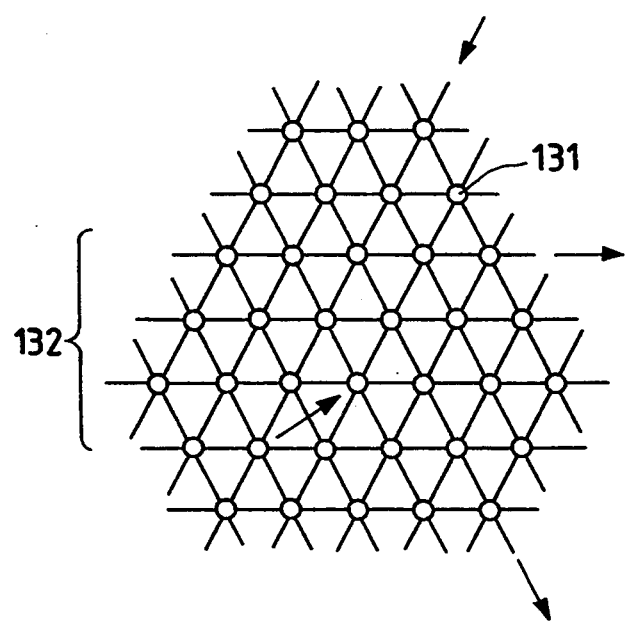
FIG. 14 is an explanatory diagram illustrating setting directions of recording tracks in a technique for recording and retrieving information provided by the present invention, wherein the atomic array on the surface of the recording medium is different from that shown in FIG. 13.

FIG. 14 shows an example wherein a hexagonal system appears on a recording surface thereof. Also in the case of this example, the unit translation vector can be taken as a scanning direction even though a combination of vectors other than that will also work as well, as long as it is obtained by linear combination of unit translation vectors.

Figure 15:
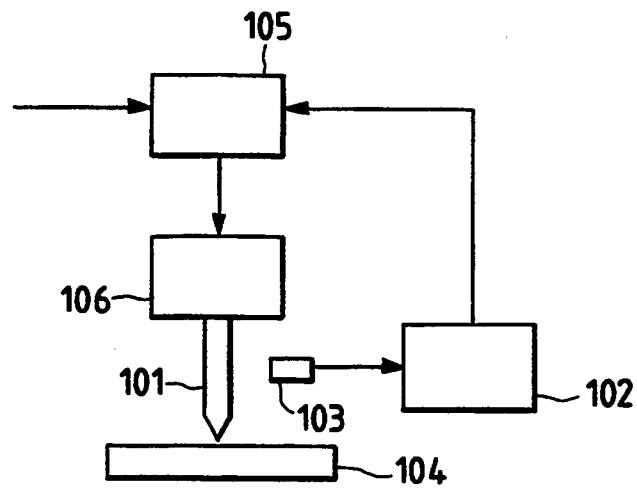
FIG. 15 is an explanatory diagram illustrating a technique for scanning a medium surface adopted by a recording and retrieving means employed in a method for recording and retrieving information provided by the present invention.

FIG. 15 depicts a technique for scanning a medium surface adopted by a recording/retrieving means. It should be noted that the majority of components constituting a mechanism not relevant to the scanning technique are not shown in the figure. This example shows a recording/retrieving means in which a single probe is used both for recording and retrieval. A probe 101 interfacing with a recording medium 104 scans the surface of the recording medium 104 in the track direction described above or in the direction crossing tracks. The speed or position of the probe 101 is monitored by a sensor 103. Typically, an optical interferometer is used as the sensor 103 to give a resolution of the order of 1 nm. A detection signal output by the sensor 103 is supplied to a speed detector 102. Receiving the detection signal, the speed detector 102 outputs signals representing the direction and the magnitude of the speed of the probe 101. The signals output by the speed detector 102 are supplied to scanning control equipment 105. Information on positions to be accessed is also input to the scanning control equipment 105 through a different route. Based on the signals and the information, the scanning control equipment 105 transmits a signal required for making an access to a target position and scanning a recording track with a high degree of precision to a probe driving unit 106.

Figure 16:
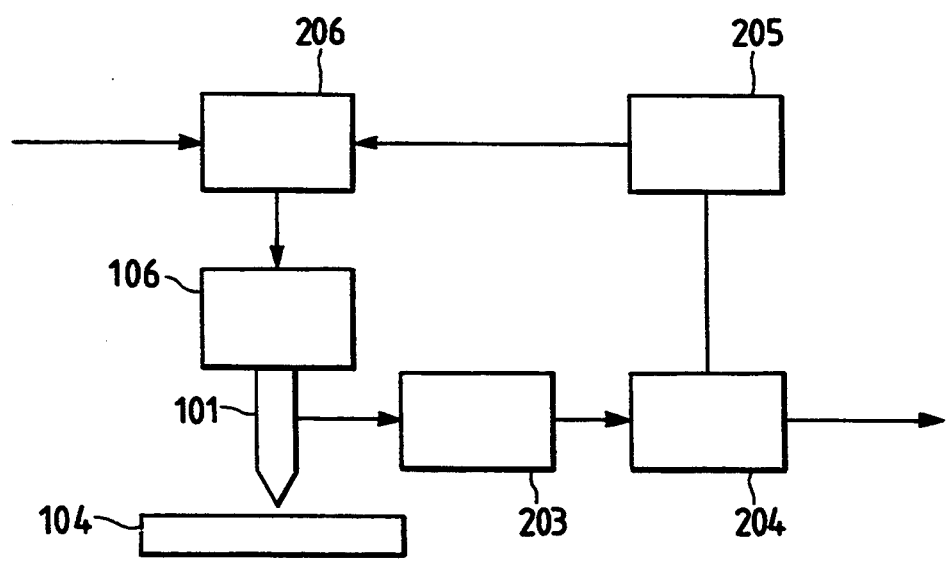
FIG. 16 is an explanatory diagram illustrating another technique for scanning a medium surface adopted by a recording and retrieving means employed in the method for recording and retrieving information provided by the present invention.

FIG. 16 shows another technique for scanning a medium surface adopted by a recording/retrieving means. It should be noted that the majority of components constituting a mechanism not relevant to the scanning technique are not shown in the figure. Much like FIG. 15, this example also shows a recording/retrieving means in which a single probe is used both for recording and retrieval. A probe 101 interfacing with recording medium 104 scans the surface of the recording medium 104 in the track direction described above or in the direction crossing tracks. In this case, however, the recording/retrieving means is characterized in that no sensor is provided for monitoring the speed and position of the probe 101. Instead, a means for identifying the current scanning state based on a signal detected by the probe 101 is provided. The signal detected by the probe 101 is supplied to a signal processing unit 203 for increasing its signal-to-noise ratio before being stored in a memory unit 204 for a predetermined period of time. Contents of the memory unit 204 are always updated in accordance with the movement of the probe 101. Accordingly, a first-in-first-out configuration will result in effective operation of the memory unit 204.

A signal analysis unit 205 analyzes the scanning state while always referencing the contents of the memory unit 204 and outputs a correction signal for correcting the scanning state to a scanning control unit 206. Information on positions to be accessed is also input to the scanning control unit 206 through a different route. Based on the signals and the information, the scanning control unit 206 transmits a signal required for making an access to a target position and scanning a recording track with a high degree of precision to a probe driving unit 106.

An example of the process of correction described above is given as follows. Let us consider a case in which a surface is scanned at a constant speed to produce a self-coincidentable spectrum known as a line spectrum as an output signal. Assume that the scanning direction is slightly shifted from a track inadvertently. With the scanning direction changed as such, the resulting signal spectrum is shifted as a whole toward the low-frequency side. In the case of a line spectrum, fortunately, the shift amount can be identified with ease. Accordingly, the scanning direction can be corrected so as to minimize the shift amount.

It is obvious that the apparatus described above has a capability of directly migrating from one sector to another or from one record to another.

Figure 17A:
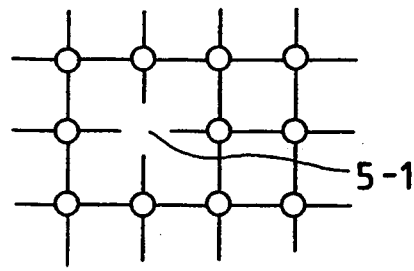
FIGS. 17(a)-(c) are explanatory diagrams illustrating the principle of operation of recording and retrieving of the method for recording and retrieving information provided by the present invention.
Figure 17B:
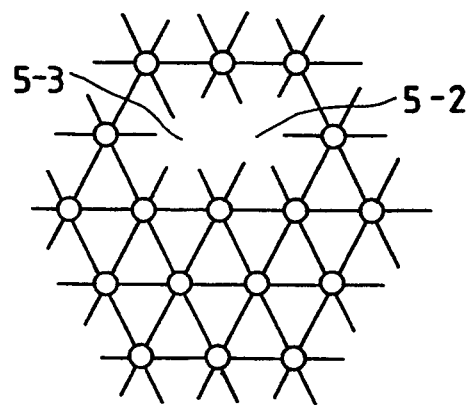
Figure 17C:
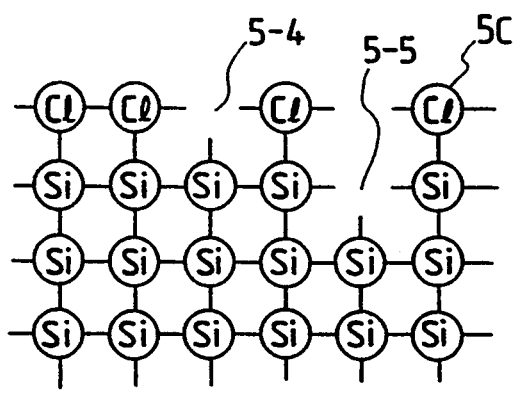

FIG. 17 depicts states of recording performed by removing or depositing atoms from or on a crystal surface. FIG. 17 (a) shows an example of recording by removing an atom from a lattice point 5-1 on the surface of simple cubic lattices (100) used as a recording surface. FIG. 17 (b) shows an example in which a hexagonal system is used as a recording surface. This figure shows a state in which two atoms are being removed from two adjacent lattice points 5-2 and 5-3 in order to store one bit of information. The same recording can, of course, be done by removing three or more atoms. FIG. 17 (c) shows an example of recording information on a recording medium by depositing a layer of Cl atoms 5C on the surface of Si crystals. The figure shows the cross section of a portion of the surface. At a point 5-4, recording is done by removing a Cl atom from the surface. At a point 5-5, however, an Si atom right under a Cl atom is also removed along with the Cl atom in order to perform information recording. It is obvious that in this way, multi-value recording can be done. In addition, information recording can be done by removing molecules instead of atoms.

As has been described by referring to FIG. 1, in the technique for removing an atom from the surface of a recording medium, an electric field applied using a very fine probe 1 field-evaporates an atom from the surface. As an alternative, a technique for field-evaporating an atom from the tip of the probe 1 can also be adopted as well. As shown in FIG. 1 (b), by reversing the electric field, an atom is conversely field-evaporated from the tip of the probe 1, filling up a vacancy on the medium-crystal surface. In this way, information recording can also be performed as well. In this case, it is clear that if the atom filling up the vacancy is of the same type as the composition atom of the recording medium, information recorded therein is erased or overwritten. Furthermore, information can also be recorded by evaporating an atom from the tip of the probe 1 and depositing it on the medium-crystal surface.

In addition, a plurality of probes can be installed in a parallel arrangement on a single probe driving system as a recording and retrieving means as shown in FIG. 5. Such an arrangement allows information to be recorded and retrieved concurrently, hence, raising the speeds of the recording and retrieving. Also in this case, since only one common driving system is employed to be shared among the probes, the apparatus can be simplified and made smaller in size.

FIG. 18 is constituted by a pair of diagrams used for explaining techniques for eliminating recorded information. FIG. 18 (a) shows a state of erasing recorded information by re-filling a vacancy 5-1 created in a recording operation with an atom 5-6. FIG. 18 (b) depicts a state of deleting recorded information by eliminating all atoms from a crystal surface layer 5d. In this case, the number of atomic layers to be eliminated can be more than one if necessary.

FIG. 19 shows a state in which recording tracks are allocated on a recording medium having a regular arrangement of atoms or molecules as described above. A large horizontal rectangle shown in the figure represents a recording track. Each recording track has a code or an index 301 at its leftmost end representing the starting point of the track. The remaining portion of a track, referred to as an information recording portion 302, is used for recording information that is supposed to be stored. The information recording portion 302 is configured into a more detailed structure for the sake of enhanced information-storage convenience.

FIG. 20 shows the structure of a track in which the entire information recording portion 302 is divided into n data sections 302-1 to 302-n. The data sections 302-1 to 302-n are delimited from each other and have a uniform length. The track has an index portion 301 at its leftmost end for indicating the start point of the track. The index portion 301 is followed by the data sections 302-1 to 302-n which each serve as an information recording area called a sector. Each sector comprises an ID (identification) part 303 and a data part 304. The ID part 303 contains a code for identifying the track which the sector pertains to, another code for distinguishing this sector from others and information for indicating whether or not this sector can be used. It should be noted that in some cases, a sector is not usable because of a defect therein. The data part 304 is used for recording information to be stored by the apparatus. The stored information may include a sign correction code if necessary. It should be noted that since all tracks are divided into sectors having a uniform length, information is recorded in a fixed-length mode.

FIG. 21 shows a track structure where data parts have different lengths from track to track. Each track has an index portion 501 at its leftmost end for indicating the start point of the track. The index portion 501 is followed by a home address 502 for recording information indicating whether or not the track is usable, a code for distinguishing this track from others and the length of its data part. As described above, the track may have a number of defects so that it cannot be used. The home address 502 is followed by n records 503-0 to 503-n-1 each including a data part. Each record 503 comprises a data part 505 for recording information to be stored by the apparatus and a record control part 504 for storing a sign for distinguishing this record from others pertaining to this track. In some cases, the head record 503-0 referred to as record 0 is used for special purposes such as defect relief. Since the data part 505 is different in length from track to track, information is stored in the track in the so-called variable-length mode.

The following is description of a measure to counter a defect in a portion of a track which prevents information from being recorded normally in the defective portion. There are some differences in defect countermeasure between the fixed-length mode and the variable-length mode. Basically, however, the countermeasure specifies a recording area to be used as a substitute for the defective portion. In the fixed-length mode, a code indicating the existence of a defect and the position of a replacement sector are recorded in the ID part of a sector with a defective data part. In this case, replacement sectors are allocated in advance. As for the variable-length mode, a code indicating a defect existing in a track and the position of a replacement track are recorded in the home address of the defective track. In this case, the defective track is discarded because, ill general, the lengths of the record portions are different from track to track. Unlike the fixed-length mode, a replacement track cannot thus be allocated in advance. As a result, it is difficult to cope with a defect at a record-level. If replacement records can be preserved in a track in one way or another, however, a defective record is treated by merely not using it. In this case, the location of a defective record is recorded on record 0.

FIG. 22 explains a relief method for coping with an edge dislocation 5e existing near the crystal surface of a recording medium as shown in part (a) of the figure. In this case, by removing excess atoms 5f as shown in FIG. 22 (b), a surface that still tolerates information recording can be produced.

According to the aforementioned technique for recording information provided by the present invention, information is recorded by utilizing the states of a recording-medium surface at an atomic level. A recording apparatus having an ultra-high recording density at an atomic level can thus be implemented. In addition, since information is recorded at a fine atomic level and recording positions of information are determined by deviation from the regular atomic arrangement of crystal lattices, non-volatility of stored information is guaranteed. Moreover, by adopting the recording technique provided by the present invention, a memory with a recording area of 10 microns $\times$ 10 microns or a recording density of about $1 \times 10^{15}$ bits/cm$^2$ can be realized. Moreover, since the STM probe scans a medium surface at a high speed, it takes only a short time for the probe to record information on the surface at an atomic level. As a result, recording of information at a very high speed can theoretically be implemented.

Figure 23:
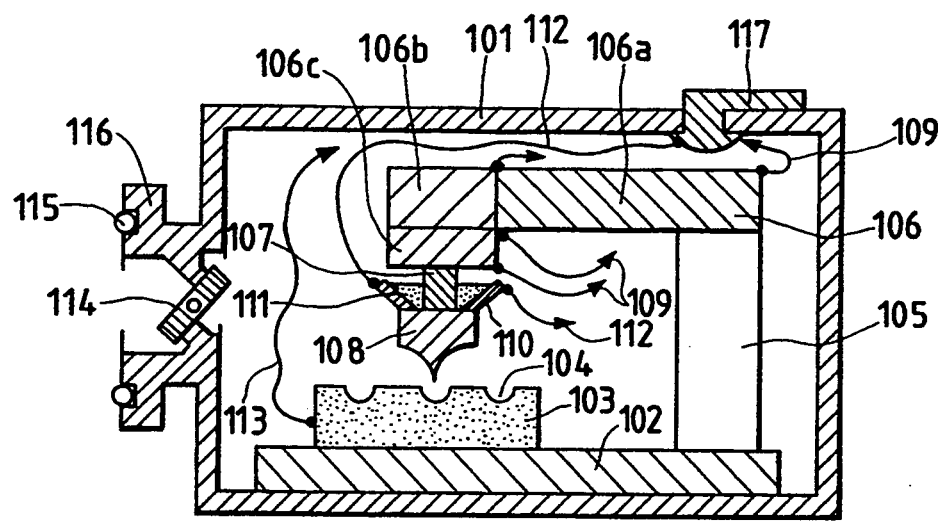
FIG. 23 is a diagrammatic configuration of a cassette-type atomic-level fabrication recording/reproduction apparatus provided by the present invention.

FIG. 23 shows still another embodiment of the present invention. This embodiment implements an atomic-level recording apparatus in accordance with the present invention as simple and compact equipment. A board 103 serving as a recording medium, a probe 108 and movement machinery 106 for driving the probe 108 are accommodated in a portable small-size cassette-type container 101. As shown in the figure, the small-size container 101 includes a main base 102 on which the board 103 is fixed. Hollows 104 shown exaggeratedly on the outer surface of the board 103 are spots from which atoms or clusters of atoms have been eliminated. The hollows 104 each represent one bit of recorded information. A fixed base 105 is further fixed on the main base 102. The movement machinery 106 is attached on the fixed base 105 in such a way that the movement can also be realized as well. If such an internal vacuum exhausting apparatus displays sufficient performance, of course, neither external vacuum exhausting apparatus nor equipment relevant thereto is required. The container 101 has approximately ten terminals 117 to which all the lead wires inside the container 101 are connected. Arrows at the ends of the lead wires denote connections to the terminals 117. Since the terminals 117 are exposed to the outside of the container 101 for external access, it is possible to apply external voltages to the internal lead wires and to measure internal signals with ease. The principle of recording and retrieving information into and from the apparatus has already been explained by referring to FIG. 1.

Figure 24:
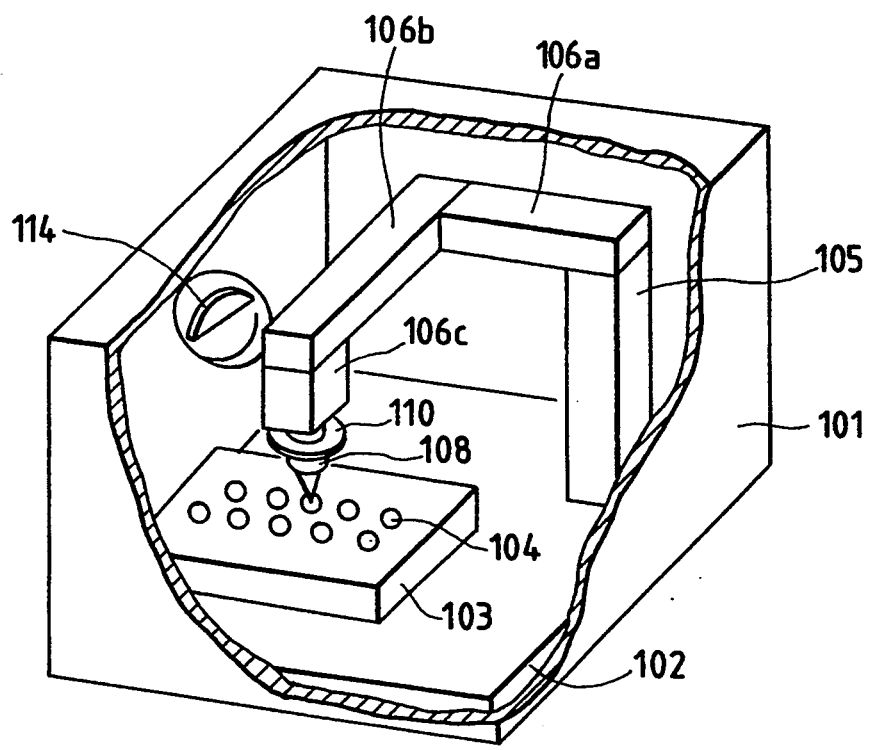
FIG. 24 is a perspective view of a cassette-type atomic-level fabrication recording/reproduction apparatus provided by the present invention.

FIG. 24 shows a perspective view of a cassette recording/reproduction apparatus adopting the atomic-level fabrication technique provided by the present invention. The figure makes the apparatus shown in FIG. 23 easy to understand. It should be noted that neither terminals nor lead wires are shown in the figure.

Figure 25:
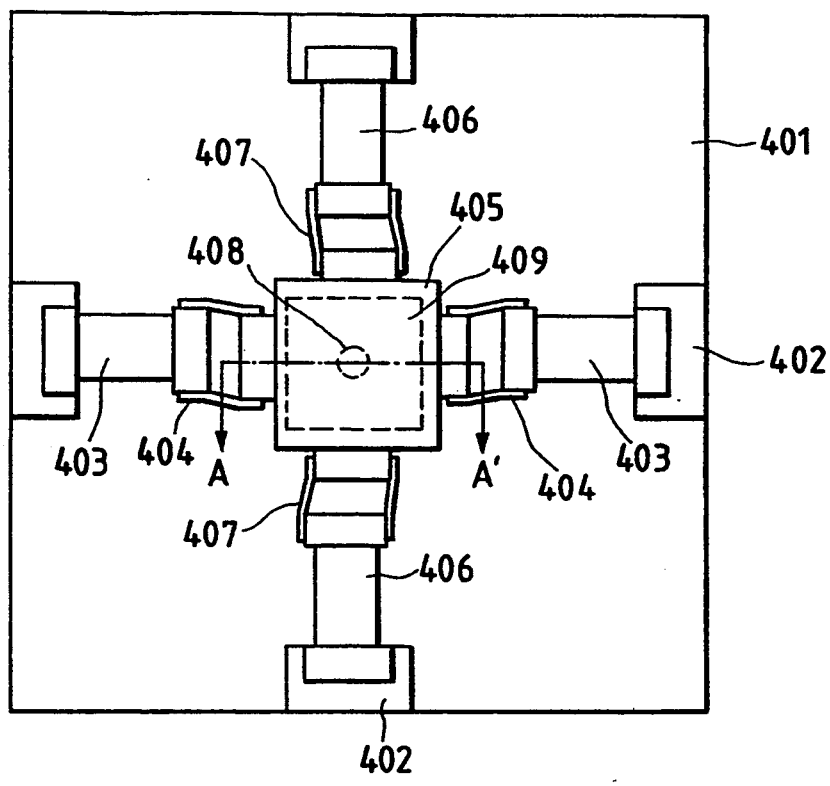
FIG. 25 is a plan view showing another typical configuration of a probe moving mechanism employed in the cassette-type atomic-level fabrication recording/reproduction apparatus provided by the present invention.

FIG. 25 is a plan view showing another typical configuration of the movement machineries employed in the cassette recording/reproduction apparatus adopting the atomic-level fabrication technique provided by the present invention. In this configuration example, a total of four movement machineries, i.e. two X-direction movement machineries 403 and two Y-direction movement machineries 406, are employed. At the center of these movement machineries, a Z-direction movement machinery 501 is installed. A probe 408 is fixed beneath the Z-direction movement machinery 501. Four fixed bases 402 are fixed on a main base 401. The two X-direction movement machineries 403 for driving the probe 408 in the X direction are linked to a central support body 405 by parallel springs 404. Likewise, the two Y-direction movement machineries 406 for driving the probe 408 in the Y direction are linked to the central support body 405 by parallel springs 407. The right-side X-direction movement machinery contracts while the left-side X-direction movement machinery expands or vice verse in order to move the probe 408 in the X direction. The Y-direction movement machineries 406 perform similar operations in order to move the probe 408 in the Y direction. It should be noted that lead wires connected to the movement machineries for driving the probe 408, the probe 408 itself and a board 409 are not shown in the figure.

Figure 26:
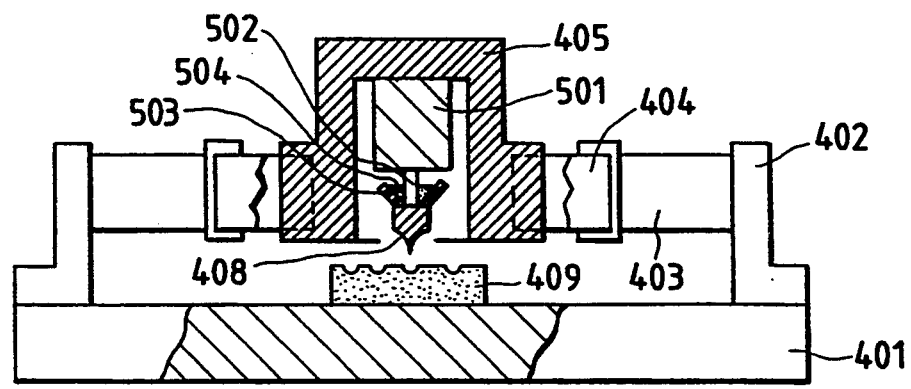
FIG. 26 is a cross-sectional diagram taken along the AA' plane shown in FIG. 25

FIG. 26 is a cross-sectional view taken along a line A-A' of the probe movement machineries shown in FIG. 25. As shown in the figure, the Z-direction movement machinery 501 is fixed on the lower surface of the central support body 405. The probe 408 is attached to the Z-direction movement machinery 501 by fittings 502. On the top of the probe 408, a stop 503 is provided for holding a stuck material 504. The movement machineries employed in this embodiment are made of a rigid material. In addition, since the dimension in the height direction can be made small, a compact recording/retrieving apparatus with a high degree of movement accuracy can be provided.

Figure 27:
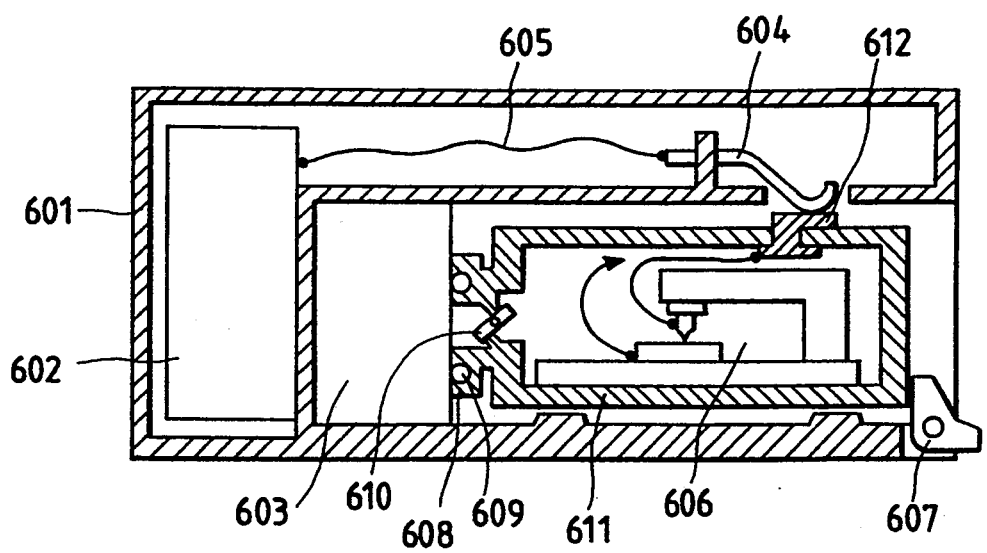
FIG. 27 is a cross-sectional schematic diagram showing an atomic-level fabrication recording/reproduction apparatus provided by the present invention put inside the body of the main apparatus.

FIG. 27 is a fragmentary sectional view of a portion of a main apparatus for actually recording and retrieving information. It accommodates a cassette recording/retrieving apparatus 606 adopting the atomic-level fabrication technique provided by the present invention. The main apparatus is linked typically to a computer. A signal processing/controlling apparatus 602 and a vacuum exhausting apparatus 603 is accommodated in a cabinet 601 of the main apparatus. The cabinet 601 is also provided with about ten spring contacts 604 which are connected to the signal processing/controlling apparatus 602 by lead wires 605. When the cassette atomic-level fabrication recording/retrieving apparatus 606 is inserted into the main apparatus and fixed therein with a lock handle 607, a plunger 608 for vacuumization is stuck closely to a vacuum exhausting apparatus 603. At that time, the connection surfaces between the plunger 608 and the vacuum exhausting apparatus 603 is sealed by an O-shaped ring 609 so that no air is leaked into the vacuum space. In such an arrangement, opening a valve 610 will further increase the degree of the vacuum inside a container 611 due to vacuumization by the vacuum exhausting apparatus 603. If a vacuum exhausting apparatus inside the cassette atomic-level fabrication recording/retrieving apparatus can exhaust the internal air to a vacuum state sufficiently, no external vacuumization is of course required. On the other hand, the insertion of the cassette atomic-level fabrication recording/retrieving apparatus 606 into the main apparatus also brings terminals 612 into contact with the spring contact points 604 on the main-body side, establishing electrical connection. In this way, the signal processing/controlling apparatus 602 is connected to an external system performing operations to record and retrieve information, such as a computer which is not shown in the figure. The signal processing/controlling apparatus 602 outputs a signal based on an instruction from the external system, requesting that data be recorded or retrieved/read into or from the board.

Figure 28:
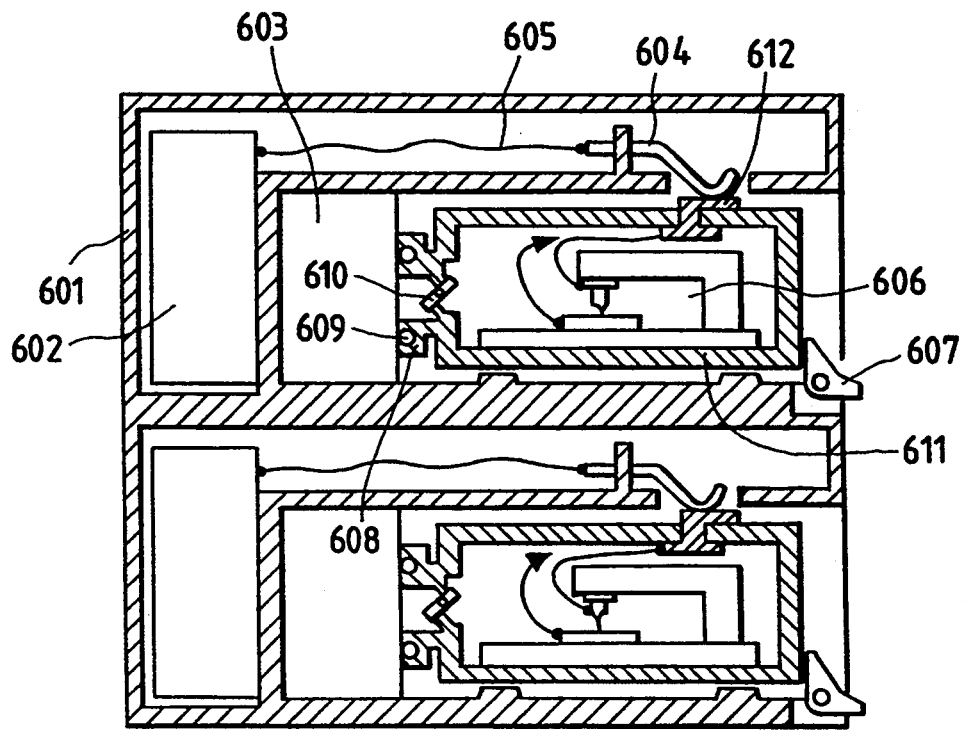
FIG. 28 is a cross-sectional schematic diagram showing a typical configuration allowing a plurality of atomic-level fabrication recording/reproduction apparatuses provided by the present invention to be put inside the body of the main apparatus.

FIG. 28 is a fragmentary sectional view of a portion of a main apparatus for actually recording and retrieving information. It accommodates a plurality of cassette recording/retrieving apparatuses 606 each adopting the atomic-level fabrication technique provided by the present invention. This figure shows a particular configuration comprising two cassette recording/retrieving apparatuses shown in FIG. 27. The figure shows an example in which only two cassette recording/retrieving apparatuses 606 each adopting the atomic-level fabrication technique are mounted with one placed above the other. However, this example also suggests that as many as one hundred cassettes can also be mounted at one time with ease as well. With so many cassettes, an apparatus that can store information to the amount of ten tera-bytes can be implemented.

As described above, the present invention provides a compact recording/retrieving cassette that allows information to the amount of one hundred giga-bytes to be recorded and retrieved on and from an extremely small board with an effective surface area of one square mm. In addition, as many as one hundred atomic-level recording/retrieving cassettes can be mounted together with ease to give an apparatus which allows a very large amount of information (as much as ten tera-bytes) to be recorded and retrieved therein and therefrom.

Figure 29:
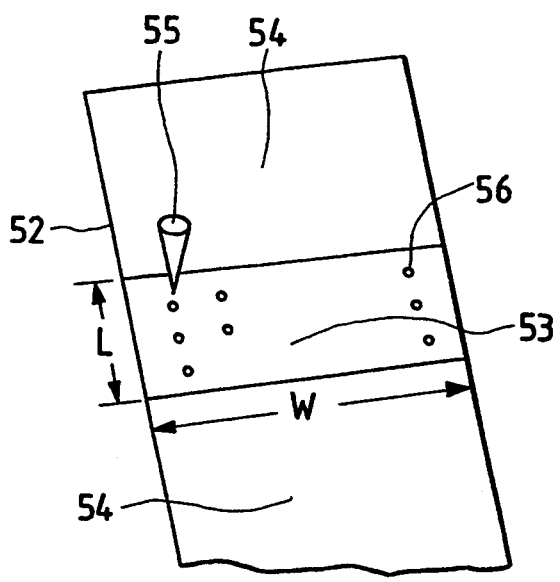
FIG. 29 is a process explanatory diagram showing a technique for manufacturing N-type field effect transistors using the surface atom fabrication method provided by the present invention.

Next, an embodiment which applies the atomic-level fabrication technique provided by the present invention to fine semiconductor manufacturing is described. FIG. 29 shows a process of manufacturing N-type field-effect transistors. First of all, high-concentration N-type areas 54 are formed by ion implantation and an annealing process in advance at both edges of an area 53 having a length of L and a width of W on a semiconductor crystal surface. The area 53 is to be used as an active area. A clean surface is then formed on the area 53 using chemical treatment and thermal treatment in an ultra-vacuum environment. Later on, an atomic image of the area is observed by using an STM probe 55 in order to detect spots to be filled up with impurity atoms 56. Subsequently, the detected spots are filled up with impurity atoms 56 with a predetermined concentration by using the STM probe 55, the operation of which is based on field-evaporation and field-deposition phenomena.

Figure 30:
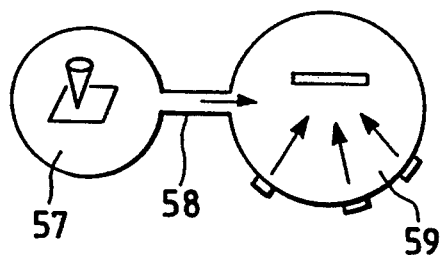
FIG. 30 is a diagram showing an example of a diagrammatic configuration of an apparatus used for performing the process shown in FIG. 29.

The process described above is performed on semiconductor-board crystals 52 in an ultra-vacuum chamber 57 shown in FIG. 30. The board crystals 52 are then brought into a crystal proliferation furnace 59 through a transfer chamber 58. In the crystal proliferation chamber 59, several atomic layers of crystals of the same type as the board crystals are proliferated to complete the entire process.

Note that it is necessary to select an atomic position to which an impurity atom is to be doped so that the impurity atom implements a desired conduction type at the selected position. The selection of an atomic position is particularly important when doping an impurity atom into compound semiconductor crystals. For example, when doping Si into GaAs to produce an N-type semiconductor, it is necessary to replace a Ga atom with an Si atom.

Figure 31:
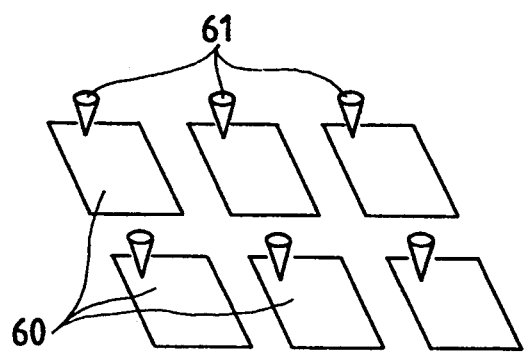
FIG. 31 is a diagram showing an example of the state of a fabrication process applied at the same time to a plurality of integrated-circuit chips by means of a plurality of probes.
Figure 32A:
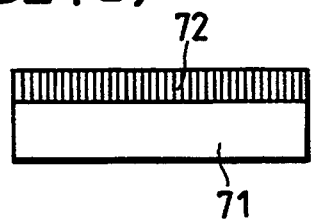
FIGS. 32(a)-(e) constitute a flow diagram showing a technique for manufacturing a quantum wire provided by the present invention.
Figure 32B:
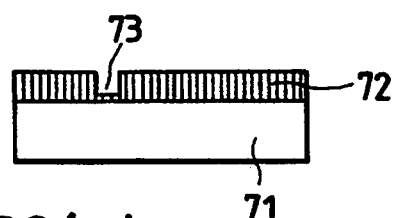
Figure 32C:
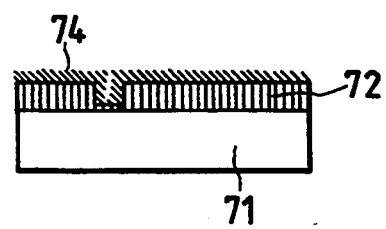
Figure 32D:
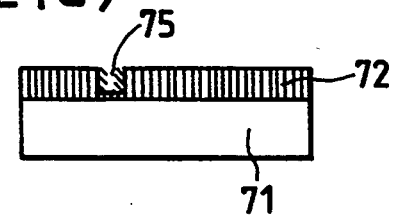
Figure 32E:
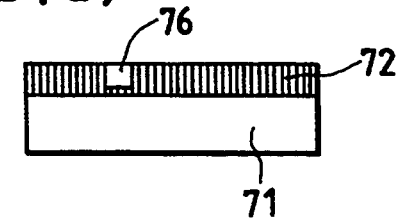

It should be noted that when forming integrated semiconductor devices 60 in accordance with a master pattern, as many STM probes 61 as chips to be formed are arranged at proper positions, being separated by gaps from a semiconductor crystal surface as shown in FIG. 31. Since the arrangement allows processing to be done concurrently, it is possible to substantially shorten the time to manufacture the devices.

In this way, the surface fabrication technique provided by the present invention can be applied to the manufacture of fine semiconductor devices, allowing the concentration and special positions of impurity atoms being doped to be controlled with a very high degree of accuracy. Accordingly, it becomes possible to control the operation voltage at 100% accuracy. In addition, since the positions of the impurity atoms can be arranged in a correct order inside an active layer region, it is possible to considerably reduce dispersion of carrier impurity atoms. As a matter of fact, it has been verified that an effect of increasing carrier mobility by a factor of about ten has been verified. In addition, since the position to which an impurity atom is to be doped can be determined accurately at an atomic level, an impurity concentration and an electrical activation ratio computed at a design stage can be 100% implemented.

Next, an embodiment applying the surface fabrication technique provided by the present invention to a method of manufacturing a quantum wire is described.

FIG. 32 shows the method of manufacturing a quantum wire in accordance with the present invention. AlGaAs 72 is proliferated by 50 nm in an ultra-vacuum environment using a molecular beam epitaxial growth method on a surface cleaned board 71 made of GaAs 100 at a board temperature of 600 degrees. Subsequently, an electric field of about 10 V/nm is applied between a scanning tunnelling microscope and the AlGaAs 72 without exposing the board 71 to the atmosphere to remove atoms one after another. These operations are repeated to form a trench 73 with a depth of about 2 nm and a width of approximately 2 nm. At the board temperature of 600 degrees, Ga is deposited using Knudsen's cells on the board 71 to form a Ga atomic layer 74 with a thickness of one atom thereon. Later on, the board 71 and the Ga layer 74 are kept at this board temperature for about 200 seconds to keep only a Ga layer 75 in close proximity to the corners of the chemically active trench 73 and remove the remaining Ga layer 74 by re-evaporation through thermal desorption. Then, at the same board temperature, As is deposited using Knudsen's cells on the board 71 to proliferate GaAs only on a region where Ga exists. In this way, a quantum wire can be formed along a thin trench.

Next, a method for forming a quantum interference device using the surface fabrication technique provided by the present invention is described.

Figure 33A:
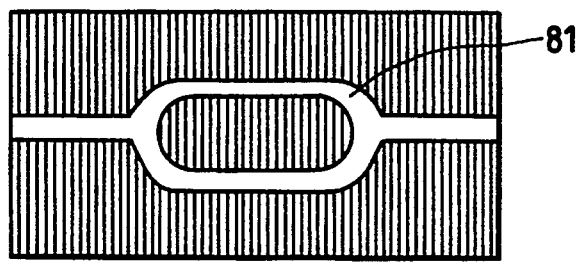
FIGS. 33(a) and (b) constitute is a flow diagram showing a technique for manufacturing a quantum interference device provided by the present invention.
Figure 33B:
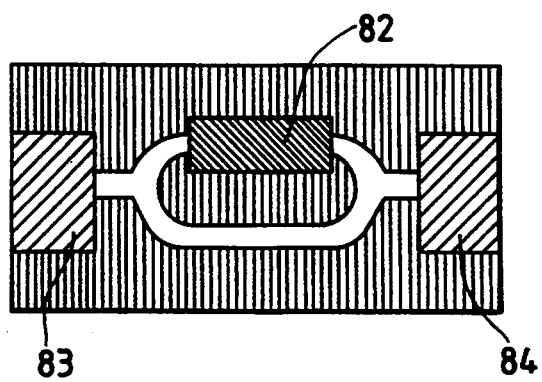

FIG. 33 shows a technique for manufacturing a quantum interference device in accordance with the present invention. First of all, a quantum wire 81 with a shape shown in FIG. 33 (a) is formed by using the same quantum-wire fabrication technique described above. Then, by using the conventional process for forming a GaAs MESFET, electrodes such as a tungsten silicide gate 82, a source 83 and a drain 84 are created to complete the forming of a quantum interference device on a plane. This device is capable of producing large changes in current from a minute voltage signal. In comparison to the conventional field-effect transistor, the quantum interference device has a mutual conductance ten times that of the former and a cut-off frequency three times as great.

Figure 34A:
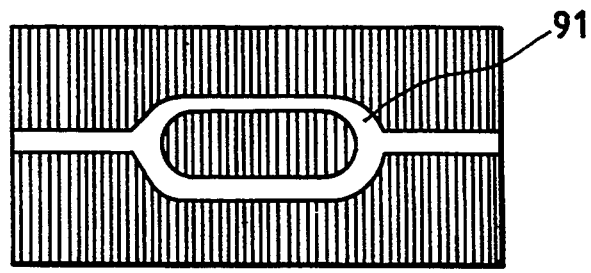
FIGS. 34(a) and (b) constitute is a flow diagram showing a technique for manufacturing a differential amplifier using a quantum interference effect provided by the present invention.
Figure 34B:
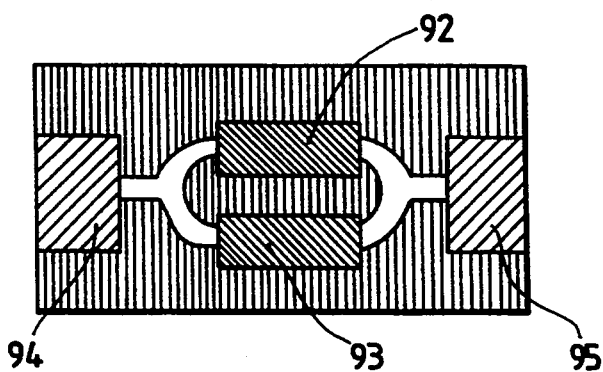

FIG. 34 shows a technique for forming a differential amplifier device by utilizing a quantum interference effect in accordance with the present invention. First of all, a quantum wire 91 is formed on a board surface by using the same quantum-wire fabrication technique described above. Then, by using the conventional process for forming a GaAs MESFET, electrodes such as a tungsten silicide gate 92, a source 93 and a drain 94 are created to complete the forming of a differential amplifier device. This device is capable of producing large changes in current from minute voltage differences. In comparison to the conventional field-effect transistor, the differential amplifier device has a mutual conductance ten times as great.

We claim:

1. A surface atom fabrication method for fabricating the surface of a specimen at an atomic scale, comprising the steps of:
   installing a probe having a tip facing to the surface of said specimen to undergo fabrication;
   applying a negative voltage for forming an electric field between said probe and said specimen and scanning said probe across said specimen, wherein said electric field is large enough for field-evaporating atoms from said specimen; and
   selectively field-evaporating said atoms from the surface of said specimen to form empty atomic positions in the specimen surface.

2. A surface atom fabrication method for fabricating the surface of a specimen at an atomic scale, comprising the steps of:
   installing a probe having a tip facing to the surface of said specimen to undergo fabrication;
   applying a voltage for forming an electric field between said probe and said specimen, wherein said electric field has a magnitude insufficient to cause changes in atomic arrangement on the surface of said specimen;
   controlling the position of said probe in a direction perpendicular to the surface of said specimen in order to keep a tunnelling current flowing between said probe and said specimen constant;
   while the position of said probe is controlled in this way, scanning the surface of said specimen with said probe in a direction parallel to the surface of said specimen;
   during said scanning, applying a pulsative negative voltage for forming an electric field between said probe and said specimen, wherein said electric field is large enough to field-evaporate atoms constituting said specimen; and
   selectively field-evaporating said atoms from the surface of said specimen to form empty atomic positions in the specimen surface.

3. A surface atom fabrication method for fabricating the surface of a specimen at an atomic scale, comprising the steps of:

installing a probe having a tip facing to the surface of said specimen to undergo fabrication;

applying a voltage for forming an electric field between said probe and said specimen, wherein said electric field has a magnitude insufficient to cause changes in atomic arrangement on the surface of said specimen;

controlling the position of said probe in a direction perpendicular to the surface of said specimen in order to keep a tunnelling current flowing between said probe and said specimen constant;

while the position of said probe is controlled in this way, scanning the surface of said specimen with said probe in a direction parallel to the surface of said specimen;

during the scanning, obtaining variations in scanning probe position, in the direction perpendicular to said specimen surface, as image information using a scanning tunnelling microscope for displaying the profile of said specimen surface as an image;

during the scanning, applying a negative pulsative voltage for forming a negative electric field between said probe and said specimen, wherein said negative electric field is large enough to field-evaporate atoms constituting said specimen;

selectively field-evaporating said atoms from the surface of said specimen to form empty atomic positions in the specimen surface;

applying a positive pulsative voltage for forming a positive electric field between said probe and said specimen, wherein said positive electric field is large enough to field-evaporate atoms constituting said probe; and selectively field-evaporating and depositing said atoms from said probe into at least some of the empty atomic positions on the surface of said specimen.

4. A surface atom fabrication method for fabricating the surface of a specimen at an atomic scale, comprising the steps of:

installing a probe having a tip facing to the surface of said specimen to undergo fabrication;

applying a voltage for forming an electric field between said probe and said specimen, wherein said electric field has a magnitude that causes no changes in atomic arrangement on the surface of said specimen;

controlling the position of said probe in a direction perpendicular to the surface of said specimen in order to keep a tunnelling current flowing between said probe and said specimen constant;

while the position of said probe is controlled in this way, scanning the surface of said specimen with said probe in a direction parallel to the surface of said specimen;

during the scanning, storing variations in position in said direction perpendicular to said specimen's surface of said scanning probe;

rescanning the surface of said specimen along said scanning trace with said probe moved in a direction perpendicular to said specimen surface in accordance with said stored variations;

during said rescanning, applying a continuous or pulsative negative voltage for forming another electric field between said probe and said specimen; and selectively field-evaporating said atoms from the surface of said specimen to form empty atomic positions in the specimen surface.

5. A surface atom fabrication method for fabricating the surface of a specimen at an atomic scale comprising the steps of:

installing a probe having a tip facing to the surface of said specimen to undergo fabrication;

applying a voltage for forming an electric field between said probe and said specimen, wherein said electric field has a magnitude that causes no changes in atomic arrangement on the surface of said specimen;

controlling the position of said probe in a direction perpendicular to the surface of said specimen in order to keep a tunnelling current flowing between said probe and said specimen constant;

while the position of said probe is controlled in this way, scanning the surface of said specimen with said probe in a direction parallel to the surface of said specimen;

during the scanning, storing variations in position in said direction perpendicular to said specimen's surface of said scanning probe;

rescanning the surface of said specimen along said scanning trace with said probe moved in a direction perpendicular to said specimen surface in accordance with said stored variations or in accordance with a modulated result of said stored variations;

during said re-scanning, applying a continuous negative voltage for forming another electric field between said probe and said specimen, wherein said another electric field is large enough to field-evaporate atoms constituting said specimen; and selectively field-evaporating said atoms from the surface of said specimen to form empty atomic positions in the specimen surface.

6. A surface atom fabrication method according to claim 5, wherein the field-evaporating step applies a negative voltage to said probe relative to said specimen in order to field-evaporate atoms from said specimen, and further comprising the step of applying a positive voltage to said probe relative to said specimen in order to field-evaporate atoms from said probe.

7. A surface atom fabrication method for fabricating the surface of a specimen comprising the steps of:

installing a probe having a tip facing to the surface of said specimen to undergo fabrication;

applying a voltage for forming an electric field between said probe and said specimen, wherein said electric field has a magnitude that causes no changes in atomic arrangement on the surface of said specimen;

controlling the position of said probe in a direction perpendicular to the surface of said specimen in order to keep a tunnelling current flowing between said probe and said specimen constant;

while the position of said probe is controlled in this way, scanning the surface of said specimen with said probe in a direction parallel to the surface of said specimen;

during the scanning, obtaining variations in position in the direction perpendicular to said specimen surface of said scanning probe as image information using a scanning tunnelling microscope for displaying the profile of said specimen surface as an image;

during the scanning, applying a negative pulsative voltage for forming a negative electric field between said probe and said specimen, wherein said negative electric field is sufficient to field-evaporate atoms from said specimen;

field-evaporating said atoms from the surface of said specimen to form empty atomic pockets in the specimen surface;

applying a positive pulsative voltage for forming a positive electric field between said probe and said specimen, wherein said positive electric field is sufficient to field-evaporate atoms from said probe; and selectively field-evaporating and depositing said atoms from said probe to the surface of said specimen to fill the empty atomic positions in the specimen surface.

8. A surface atom fabrication method according to claim 7, characterized in that said surface atom fabrication is performed by employing a plurality of probes installed in parallel to the surface of said specimen, wherein said probes scan the surface of said specimen collectively in a direction parallel to the surface of said specimen while moving individually in a direction perpendicular to the surface of said specimen.

9. A surface atom fabrication method according to claim 8 characterized in that in a process of scanning the surface of a fabricated specimen at an atomic scale using one of said probes with a tunnel current flowing between said one probe and said specimen kept constant, only when an area on the surface of said specimen with no atoms existing therein is detected, is a negative voltage relative to said specimen applied to said probes other than said one probe for generating an electric field more than enough for field-evaporating atoms constituting said specimen in order to field-evaporate said atoms from the surface of said specimen.

10. A surface atom fabrication method according to claim 8, characterized in that a mechanism is provided for supplying a material different from a material of said probe to the tip of said probe.

11. A surface atom fabrication method according to claim 8, characterized in that a layered material bound by Van der Waal's force is used as said specimen.

12. A surface atom fabrication method according to claim 8, characterized in that an externally generated continuous or pulsative beam is applied to either said specimen or said probe or both.

13. A surface atom fabrication method according to claim 8, characterized in that either said specimen or said probe or both are heated.

14. A surface atom fabrication method according to claim 8, characterized in that a material for weakening a force binding atoms constituting said specimen is made absorbed into the surface of said specimen prior to fabrication of the surface of said specimen.

15. A surface atom fabrication method according to claim 8, characterized in that:

in a process of scanning the surface of said specimen using said probe with a tunnelling current flowing between said probe and said specimen kept constant, a negative voltage relative to said specimen is applied to said probe for generating a negative electric field with a magnitude more than enough to field-evaporate atoms;

right after said electric field field-evaporates atoms from the surface of said specimen, a positive voltage relative to the specimen is applied to the probe for generating an electric field large enough to field evaporate atoms constituting the probe; and the positive electric field field-evaporates atoms constituting the probe, depositing said atoms on the surface of said specimen.

16. A surface atom fabrication method according to claim 7, characterized in that a mechanism is provided for supplying a material different from a material of said probe to the tip of said probe.

17. A surface atom fabrication method according to claim 7, characterized in that a layered material bound by Van der Waal's force is used as said specimen.

18. A surface atom fabrication method according to claim 7, characterized in that an externally generated continuous or pulsative beam is applied to either said specimen or said probe or both.

19. A surface atom fabrication method according to claim 7, characterized in that either said specimen or said probe or both are heated.

20. A surface atom fabrication method according to claim 7, characterized in that a material for weakening a force binding atoms constituting said specimen is made absorbed into the surface of said specimen prior to fabrication of the surface of said specimen.

21. A surface atom fabrication method according to claim 7, characterized in that:

in a process of scanning the surface of said specimen using said probe with a tunnelling current flowing between said probe and said specimen kept constant, a negative voltage relative to said specimen is applied to said probe for generating a negative electric field with a magnitude more than enough to field-evaporate atoms;

right after said electric field field-evaporates atoms from the surface of said specimen, a positive voltage relative to the specimen is applied to the probe for generating an electric field large enough to field evaporate atoms constituting the probe; and the positive electric field field-evaporates atoms constituting the probe, depositing said atoms on the surface of said specimen.

22. A surface atomic-level recording/retrieving method characterized in that when scanning a specimen surface formed by the surface atom fabrication method according to claim 16, the movement of said probe in a direction perpendicular to said specimen surface to keep a tunnelling current flowing between said specimen surface and said probe constant is divided into level ranges corresponding to units in which information is recorded.

23. A surface atom fabrication method for fabricating the surface of a specimen comprising the steps of:

installing a probe having a tip facing to the surface of said specimen to undergo fabrication;

applying a voltage for forming an electric field between said probe and said specimen, wherein said electric field has a magnitude that causes no changes in atomic arrangement on the surface of said specimen;

controlling the position of said probe in a direction perpendicular to the surface of said specimen in order to keep a tunnelling current flowing between said probe and said specimen constant;

while the position of said probe is controlled in this way, scanning a specific area on the surface of said specimen with said probe in a direction parallel to the surface of said specimen;

during said scanning, storing variations in position in said direction perpendicular to said specimen's surface of said scanning probe;

rescanning the surface of said specimen with said probe moved in a direction perpendicular to said specimen surface in accordance with said stored variations or in accordance with a modulation result of said stored variations or a portion thereof;

during the re-scanning, continuously applying a negative voltage for forming a negative electric field between said probe and said specimen, wherein said negative electric field is sufficient to field-evaporate atoms from said specimen;

field-evaporating said atoms from the surface of said specimen to form empty atomic positions in the specimen surface;

continuously applying a positive voltage for forming a positive electric field between said probe and said specimen, wherein said positive electric field is more than enough to field-evaporate atoms from said probe; and selectively field-evaporating and depositing said atoms from said probe to the surface of said specimen to fill the empty atomic positions in the specimen surface.

24. A surface atom fabrication method according to claim 23, characterized in that said surface atom fabrication is performed by employing a plurality of probes installed in parallel to the surface of said specimen, wherein said probes scan the surface of said specimen collectively in a direction parallel to the surface of said specimen while moving individually in a direction perpendicular to the surface of said specimen.

25. A surface atom fabrication method according to claim 23, characterized in that a mechanism is provided for supplying a material different from a material of said probe to the tip of said probe.

26. A surface atom fabrication method according to claim 23, characterized in that a layered material bound by Van der Waal's force is used as said specimen.

27. A surface atom fabrication method according to claim 23, characterized in that an externally generated continuous or pulsative beam is applied to either said specimen or said probe or both.

28. A surface atom fabrication method according to claim 23, characterized in that either said specimen or said probe or both are heated.

29. A surface atom fabrication method according to claim 23, characterized in that a material for weakening a force binding atoms constituting said specimen is made absorbed into the surface of said specimen prior to fabrication of the surface of said specimen.

30. A surface atom fabrication method according to claim 23 characterized in that:

a negative voltage is applied to said probe relative to a specimen surface in order to generate an electric field sufficient for field-evaporating atoms from said specimen surface; and said electric field field-evaporates atoms from said specimen surface except at a lowest portion in a range on said specimen surface scanned by said probe.

31. A surface atom fabrication apparatus equipped with a board having a regular atomic arrangement, an STM probe, a mechanism for driving said STM probe, a tunnelling-current detecting circuit and a circuit for applying an electrical effect to said probe for depositing and eliminating atoms, the improvement comprising:

a memory for storing a movement track of said STM probe; and a control circuit for applying an electrical effect to said STM probe for selectively removing atoms from desired locations of said board and for selectively depositing atoms into the desired locations to fill vacancies caused by the selective removal, while scanning said board by said STM probe in accordance with a stored movement track.

32. A surface atom fabrication apparatus equipped with a board having a regular atomic arrangement, an STM probe, a mechanism for driving said STM probe, a tunnelling-current detecting circuit and a circuit for applying an electrical effect to said probe for depositing and eliminating atoms, the improvement comprising:

a detection circuit for locating atomic positions on the surface of a specimen; and a control circuit for applying an electrical effect to said STM probe for selectively removing atoms from predetermined atomic positions of the specimen surface located by said detection circuit to form empty atomic positions thereof, and for depositing atoms into the empty atomic positions.

33. A surface atom fabrication apparatus according to claim 32 characterized by including a board temperature control means for keeping the temperature of said board constant.

34. A semiconductor active-area forming method characterized by adopting a process for forming an active area of a conduction type determined in advance in semiconductor crystals, said process comprising the steps of:

applying a strong negative electric field between an STM probe and predetermined atoms located on a clean surface serving as said active area in order to selectively field-evaporate said atoms;

filling up vacancies left by said field-evaporated atoms by using said STM probe with impurity atoms implementing said conduction type of said active area; and forming a layer of semiconductor crystals of a type identical with or different from said semiconductor crystals or an insulating layer on said entire clean surface.

35. A quantum-wire forming method, comprising the steps of:

engraving a fine trench with a width of 10 nm or smaller and a depth of 10 nm or smaller on the surface of a board made of a first semiconductor; and filling up said fine trench with a second semiconductor having a prohibition bandwidth smaller than said first semiconductor;

wherein said engraving step is performed by field-evaporating atoms from the surface of said first semiconductor board by applying a strong electric field between the surface of said first-semiconductor board and an installed probe facing to the surface of said first semiconductor board.

36. A multi-valued memory recording/reproducing method, comprising the steps of:

installing a probe having a tip facing to the surface of said specimen to undergo fabrication;

applying a voltage for forming an electric field between said probe and said specimen, wherein said electric field has a magnitude insufficient to cause changes in atomic arrangement on the surface of said specimen;

controlling the position of said probe in a direction perpendicular to the surface of said specimen in order to keep a tunnelling current flowing between said probe and said specimen constant;

while the position of said probe is controlled in this way, scanning the surface of said specimen with said probe in a direction parallel to the surface of said specimen;

during the scanning, obtaining variations in scanning probe position, in the direction perpendicular to said specimen surface, as image information using a scanning tunnelling microscope for displaying the profile of said specimen surface as an image;

during the scanning, applying a negative pulsative voltage for forming a negative electric field between said probe and said specimen, wherein said negative electric field is large enough to field-evaporate atoms constituting said specimen;

selectively field-evaporating said atoms from the surface of said specimen to form empty atomic positions in the specimen surface;

applying a positive pulsative voltage for forming a positive electric field between said probe and said specimen, wherein said positive electric field is large enough to field-evaporate atoms constituting said probe; and selectively field-evaporating and depositing said atoms from said probe into at least some of the empty atomic positions on the surface of said specimen;

wherein an empty atomic position represents a first memory value, an atomic position containing a specimen atom represents a second memory value, and an atomic position containing a deposited probe atom represents a third memory value.

* * * * *